US011508888B2

(12) United States Patent
Lopez et al.

(10) Patent No.: US 11,508,888 B2
(45) Date of Patent: *Nov. 22, 2022

(54) LIGHT-EMITTING DEVICE ASSEMBLY WITH EMITTER ARRAY, MICRO- OR NANO-STRUCTURED LENS, AND ANGULAR FILTER

(71) Applicant: Lumileds LLC, San Jose, CA (US)

(72) Inventors: Toni Lopez, Vaals (NL); Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/555,905

(22) Filed: Dec. 20, 2021

(65) Prior Publication Data

US 2022/0271206 A1  Aug. 25, 2022

Related U.S. Application Data

(63) Continuation-in-part of application No. 17/182,005, filed on Feb. 22, 2021, now Pat. No. 11,204,153.

(51) Int. Cl.
*F21V 5/00* (2018.01)
*F21V 5/04* (2006.01)
(Continued)

(52) U.S. Cl.
CPC .............. *H01L 33/58* (2013.01); *F21V 5/002* (2013.01); *F21V 5/04* (2013.01); *F21V 9/40* (2018.02);
(Continued)

(58) Field of Classification Search
CPC . F21V 5/002; F21V 9/40; G02B 1/005; F21S 41/663
See application file for complete search history.

(56) References Cited

U.S. PATENT DOCUMENTS 7,663,084 B2  2/2010  Toshikiyo et al.
9,939,129 B2 * 4/2018  Byrnes ................... F21V 5/002
(Continued)

FOREIGN PATENT DOCUMENTS

EP  0442002 A1  2/1990
EP  1486803 A2  12/2004
(Continued)

OTHER PUBLICATIONS

Shibanuma et al., "Experimental Demonstration of Tunable Directional Scattering of Visible Light from All-Delectric Asymmetric Dimers," ACS Phototonics, 489-494 (2017).
(Continued)

*Primary Examiner* — William N Harris

(57) ABSTRACT

A light-emitting device assembly includes an emitter array of light-emitting elements, a transparent substrate, a structured lens, and an angular filter. The emitter array emits from its emission surface output light that is transmitted through the substrate, and enables selective activation of and emission from individual elements or subsets of elements of the array. The structured lens is formed on or in the substrate, and comprises micro- or nano-structured elements resulting in an effective focal length less than an effective distance between the structured lens and the emission surface. The angular filter is positioned on or in the substrate or on the emission surface and exhibits decreasing transmission or a cutoff angle with increasing angle of incidence.

20 Claims, 19 Drawing Sheets

(51) Int. Cl.
*F21V 9/40* (2018.01)
*G02B 1/00* (2006.01)
*F21Y 115/10* (2016.01)
*H01L 33/58* (2010.01)
*H01S 5/00* (2006.01)
*G02B 19/00* (2006.01)
*G02B 3/12* (2006.01)
*F21V 14/02* (2006.01)

(52) U.S. Cl.
CPC ............. *F21V 14/02* (2013.01); *G02B 1/005* (2013.01); *G02B 3/12* (2013.01); *G02B 19/0028* (2013.01); *H01S 5/005* (2013.01); *F21Y 2115/10* (2016.08)

(56) References Cited

U.S. PATENT DOCUMENTS

| | | | |
|---|---|---|---|
| 10,132,465 B2 * | 11/2018 | Byrnes | G02B 19/0014 |
| 10,330,902 B1 * | 6/2019 | Marcoux | G02B 17/006 |
| 10,408,419 B2 * | 9/2019 | Aieta | G02B 27/30 |
| 11,204,153 B1 | 12/2021 | Lopez et al. | |
| 2004/0016936 A1 | 1/2004 | Tanaka et al. | |
| 2007/0103782 A1 | 5/2007 | Lee et al. | |
| 2008/0062351 A1 | 3/2008 | Handschy et al. | |
| 2009/0236614 A1 | 9/2009 | Puscasu et al. | |
| 2010/0176411 A1 | 7/2010 | Suzuki | |
| 2010/0284201 A1 | 11/2010 | Alasaarela et al. | |
| 2011/0198619 A1 | 8/2011 | Chiang et al. | |
| 2012/0002286 A1 | 1/2012 | Tanikawa et al. | |
| 2012/0105962 A1 | 5/2012 | Fattal et al. | |
| 2013/0286633 A1 | 10/2013 | Rodriguez et al. | |
| 2015/0090862 A1 | 4/2015 | Matsui et al. | |
| 2016/0111598 A1 | 4/2016 | Cho et al. | |
| 2016/0135270 A1 | 5/2016 | Earl et al. | |
| 2016/0161644 A1 | 6/2016 | Verschuuren et al. | |
| 2016/0181485 A1 | 6/2016 | Lee | |
| 2016/0190403 A1 | 6/2016 | Verschuuren et al. | |
| 2016/0197111 A1 | 7/2016 | Coolbaugh et al. | |
| 2016/0302280 A1 | 10/2016 | Harbers et al. | |
| 2016/0306167 A1 | 10/2016 | Mossberg et al. | |
| 2016/0377272 A1 | 12/2016 | Chen et al. | |
| 2017/0017091 A1 | 1/2017 | Lee et al. | |
| 2017/0082263 A1 | 3/2017 | Byrnes et al. | |
| 2017/0082785 A1 | 3/2017 | Verschuuren et al. | |
| 2017/0288098 A1 | 10/2017 | Rodriguez et al. | |
| 2017/0350563 A1 | 12/2017 | Lunz et al. | |
| 2018/0187863 A1 | 7/2018 | Yang et al. | |
| 2018/0259155 A1 | 9/2018 | Di Trapani | |
| 2018/0274750 A1 | 9/2018 | Byrnes et al. | |
| 2019/0113727 A1 | 4/2019 | Tamma | |
| 2019/0137075 A1 | 5/2019 | Aieta et al. | |
| 2019/0257495 A1 | 8/2019 | Chen et al. | |
| 2020/0200955 A1 | 6/2020 | Lopez-Julia et al. | |
| 2021/0108778 A1 | 4/2021 | Bonanomi et al. | |
| 2021/0285625 A1 * | 9/2021 | Lopez-Julia | G02B 1/005 |
| 2021/0325016 A1 * | 10/2021 | Moser | F21S 41/663 |

FOREIGN PATENT DOCUMENTS

| | | |
|---|---|---|
| EP | 2496052 A1 | 9/2012 |
| EP | 3252834 A1 | 12/2017 |
| JP | 2001-108812 A | 4/2001 |
| JP | 2004-061905 A | 2/2004 |
| JP | 2019176105 A | 10/2019 |
| JP | 2019176106 A | 10/2019 |
| TW | 200402154 A | 2/2004 |
| TW | 200705719 A | 12/2007 |
| WO | 2006/131087 A1 | 12/2006 |
| WO | 2017/031366 A1 | 2/2017 |
| WO | 2017/040854 A1 | 3/2017 |
| WO | 2017/053309 A1 | 3/2017 |
| WO | 2017/091738 A1 | 6/2017 |
| WO | 2017/175148 A1 | 10/2017 |
| WO | 2019/079383 A1 | 4/2019 |

OTHER PUBLICATIONS

Li et al., "All-Dielectric Antenna Wavelength Router with Bidirectional Scattering of Visible Light," Nano Letters, 16-4396 (2016).

Chong et al., "Efficient Polarziation-lnsensitive Complex Wavefront Control Using Huygens' metasurfaces Based on Dielectric Resonant Meta-atoms," (2016).

Kuznetsov et al., "Optically resonant dielectric nanostructures," Science vol. 354, Issue 6314, (Nov. 18, 2016).

Cheng et al., GaN-based LEDs with Photonic Crystal Nanorod Sidewall Reflectors for Versatile Radiation Directionality control, Lasers and Electro-Optics (CLEO), Laser Science to Photonic Applications—CLEO:2011—Laser Science to Photonic Applications, May 1-6, 2011, Baltimore, MD, USA, IEEE, US, pp. 1-2.

Yang, Hung-Pin D. et al., "InGaAs submonolayer quantum-dot photonic-crystal LEDs for fiber-optic communicaitons", Microelectronics and Reliability, Elsevier Science LTd., GB, vol. 50, No. 5, May 1, 2010, 4 pages.

Lopez et al., U.S. Appl. No. 17/119,528, "Light-Emitting Device Assembly With Light Redirection or Incidence-Angle-Dependent Transmission Through an Escape Surface", filed Dec. 11, 2020, 34 pages.

From the Korean Intellectual Property Office as the ISA, Notification of Transmittal of the International Search Report and the Written Opinion of the International Searching Authority, or the Declaration, PCT/US2022/014527, dated May 16, 2022, 9 pages.

\* cited by examiner

FIG. 4A
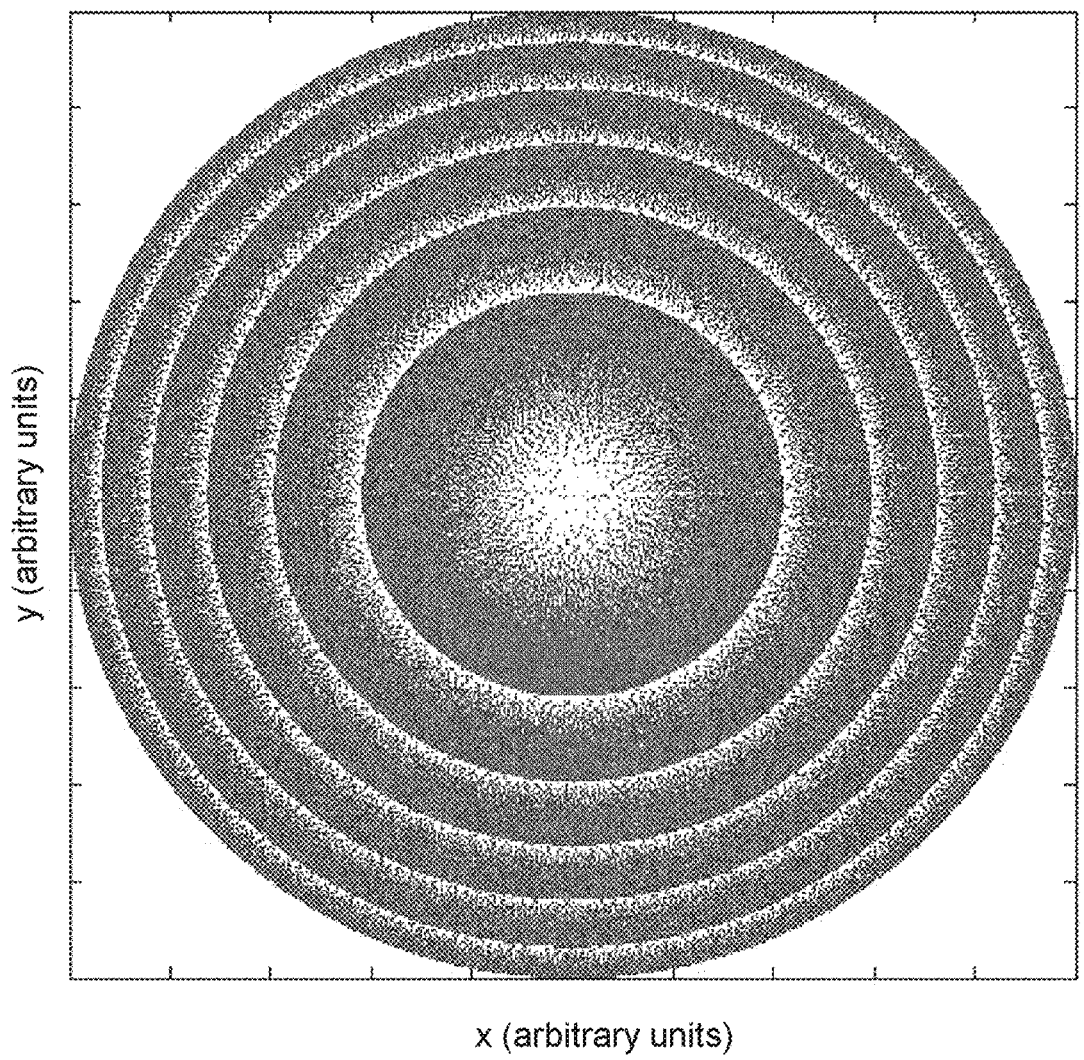
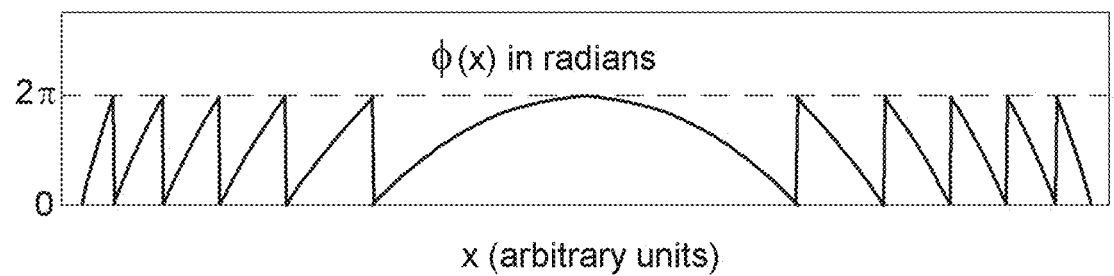
FIG. 4B

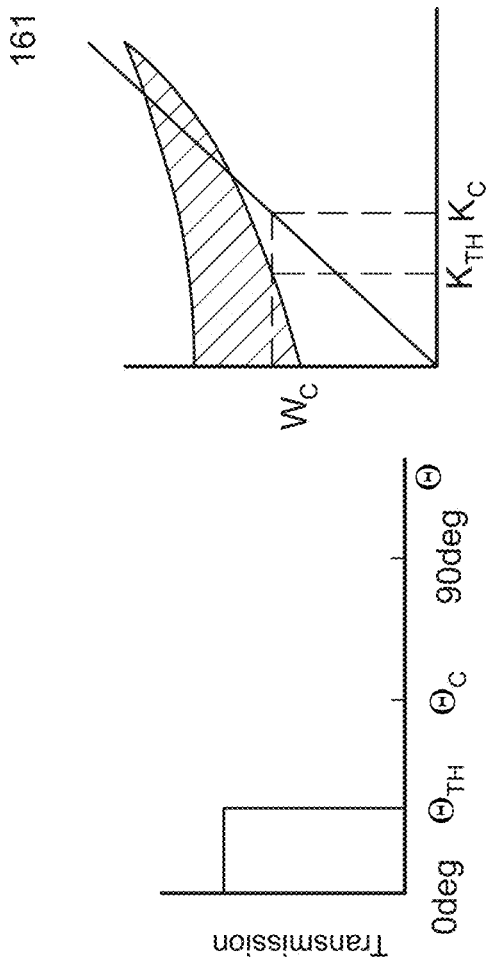
FIG. 6D
FIG. 6B
FIG. 6C
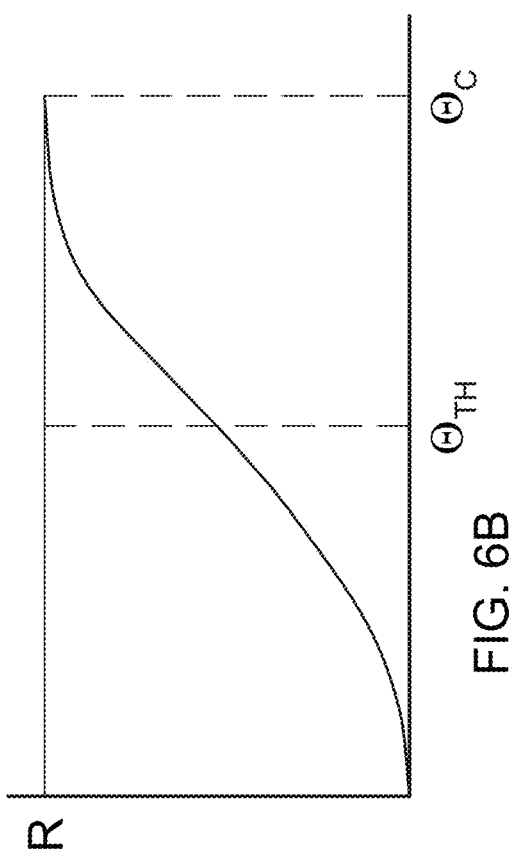
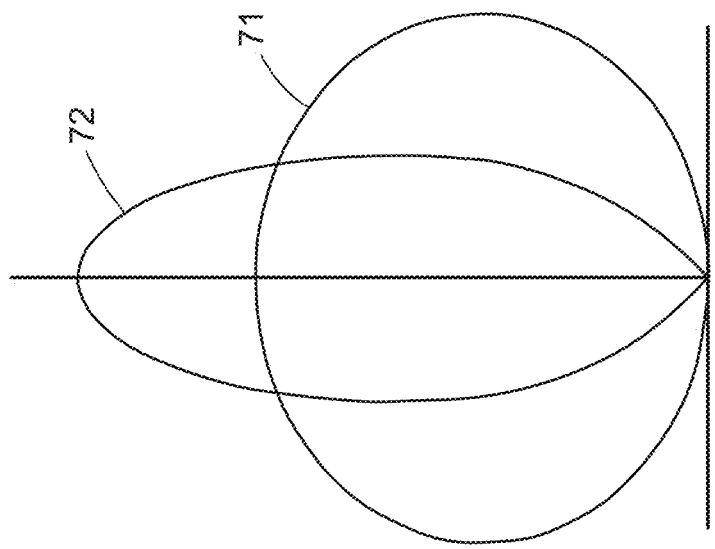
FIG. 6A

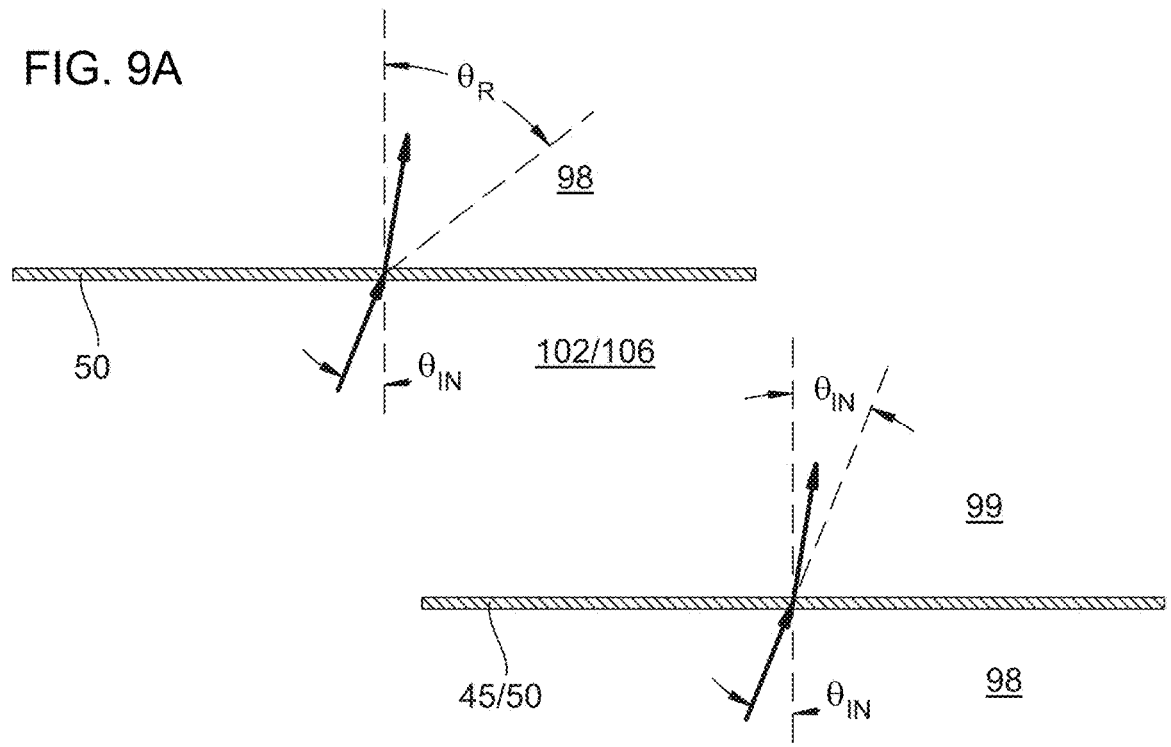
FIG. 9A
FIG. 9B
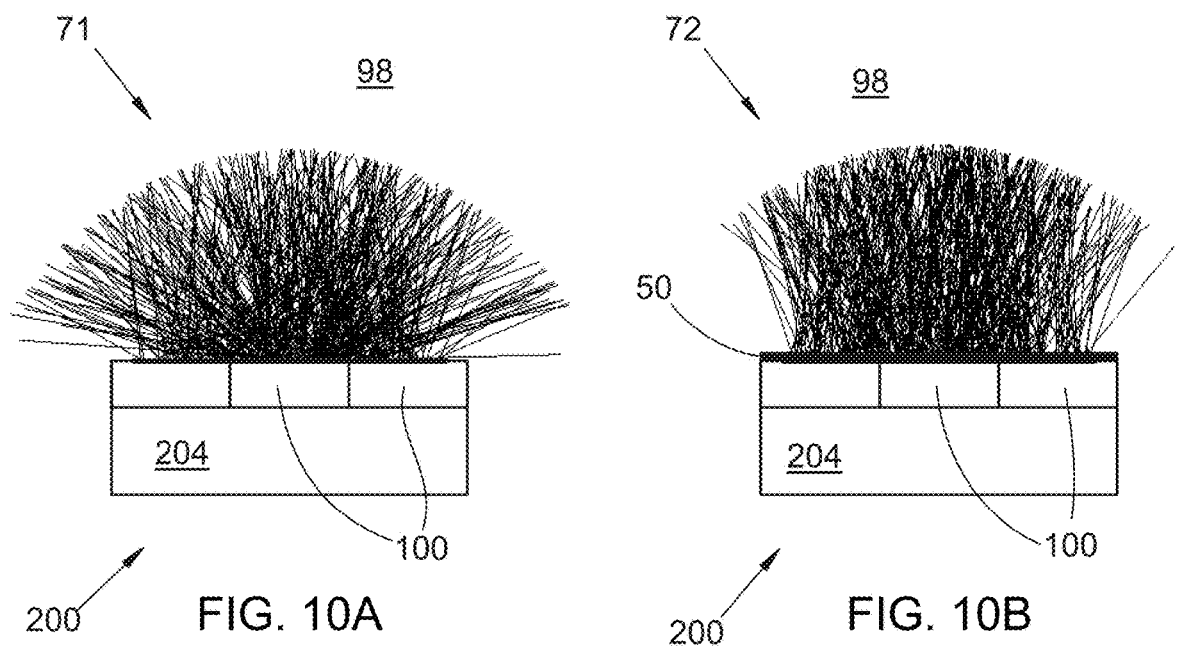
FIG. 10A
FIG. 10B

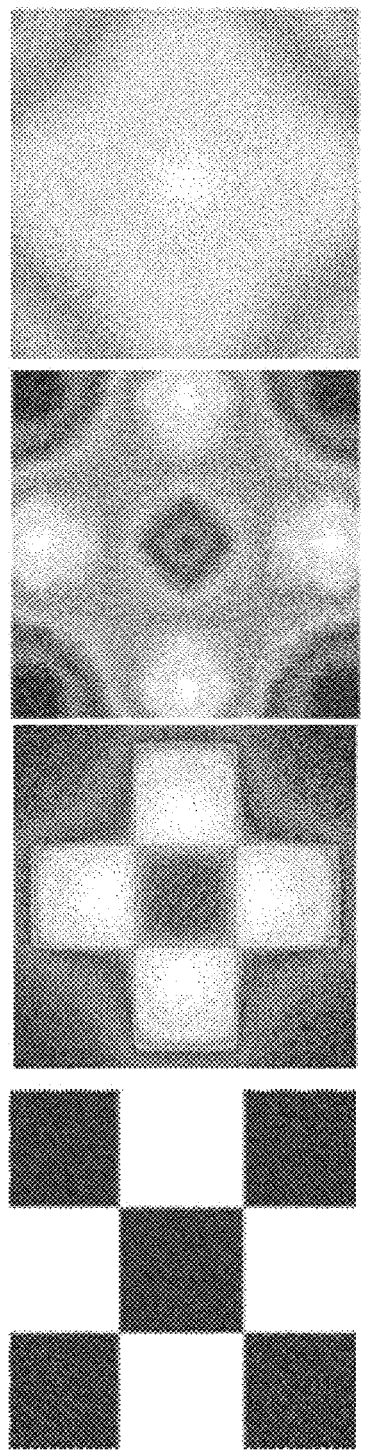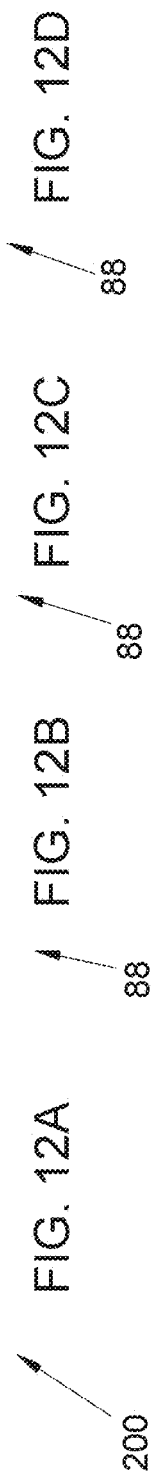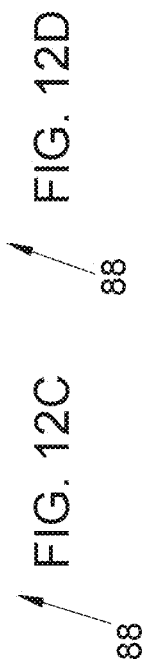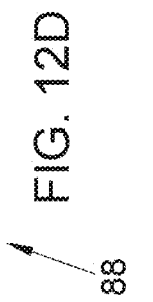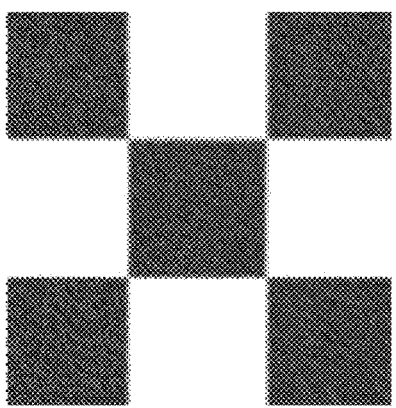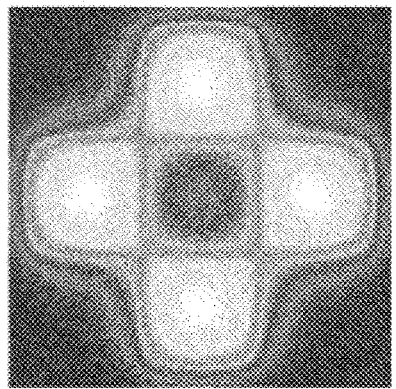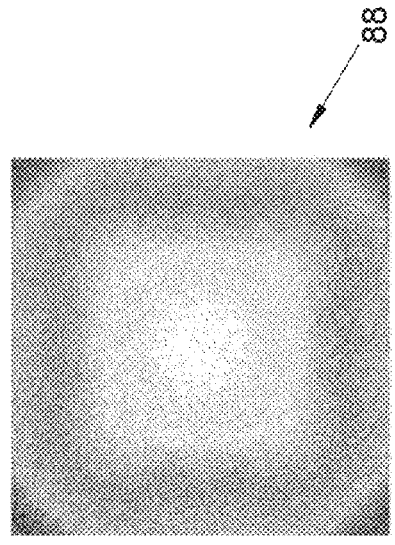

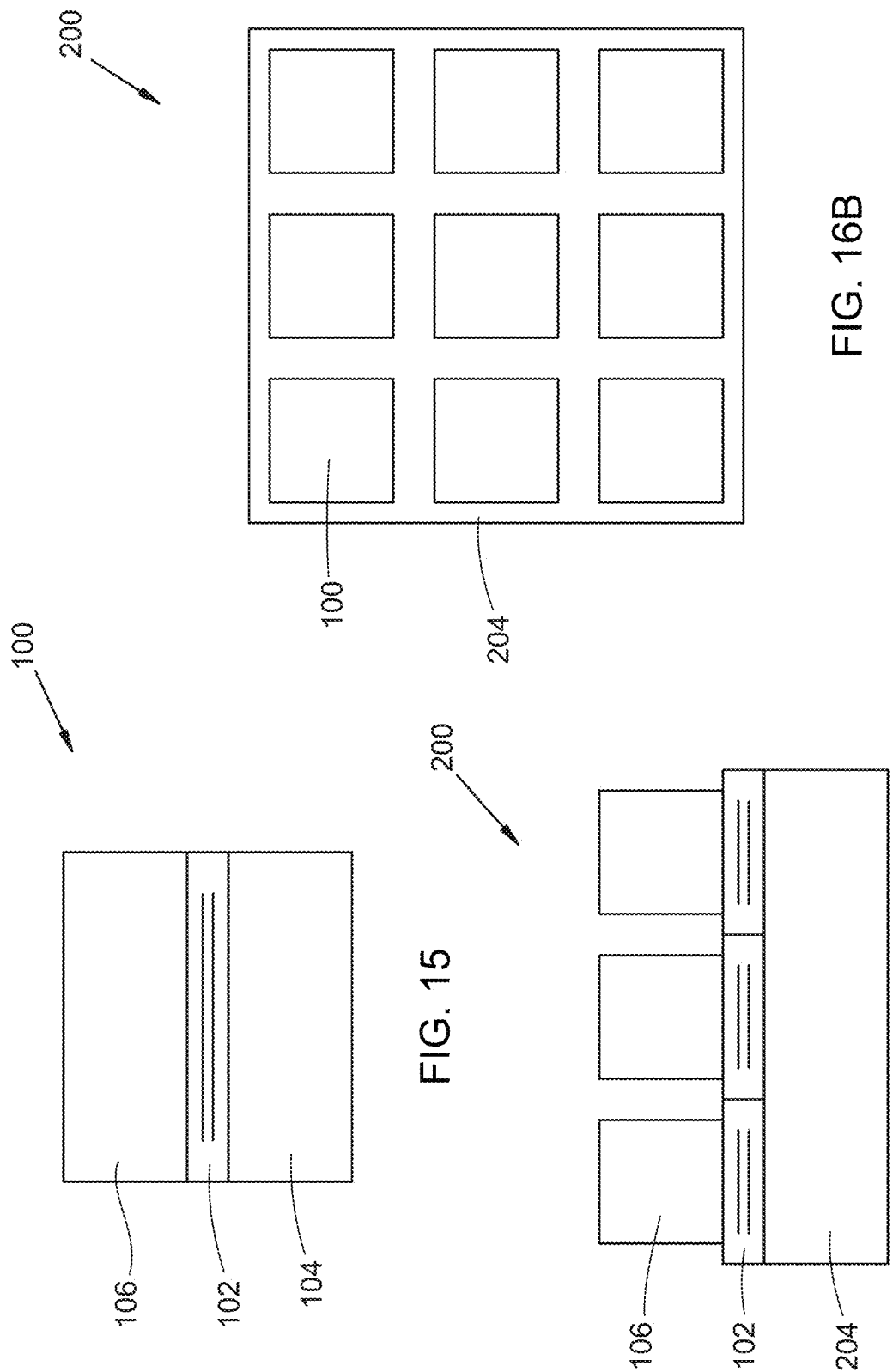

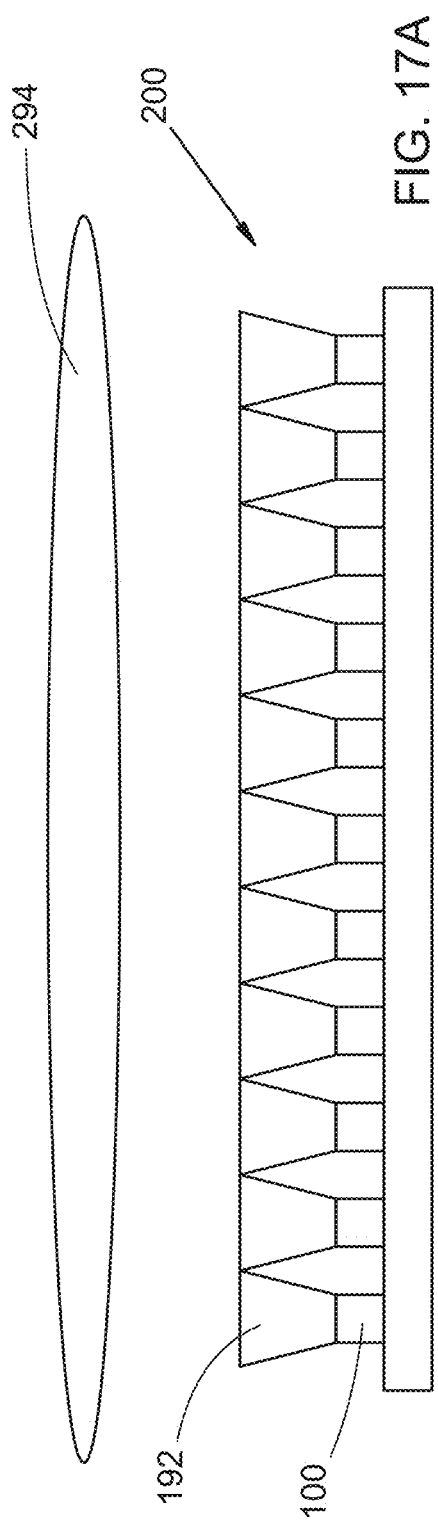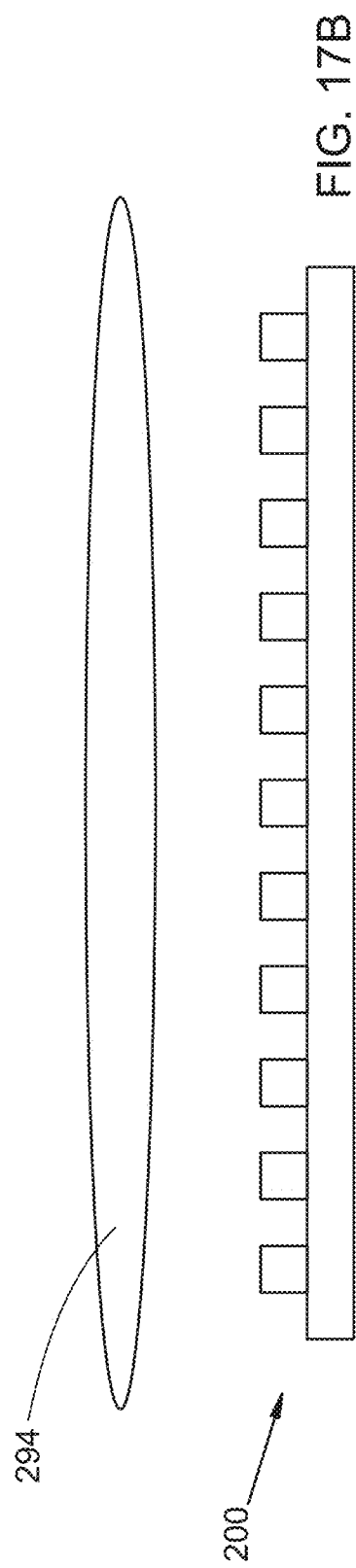

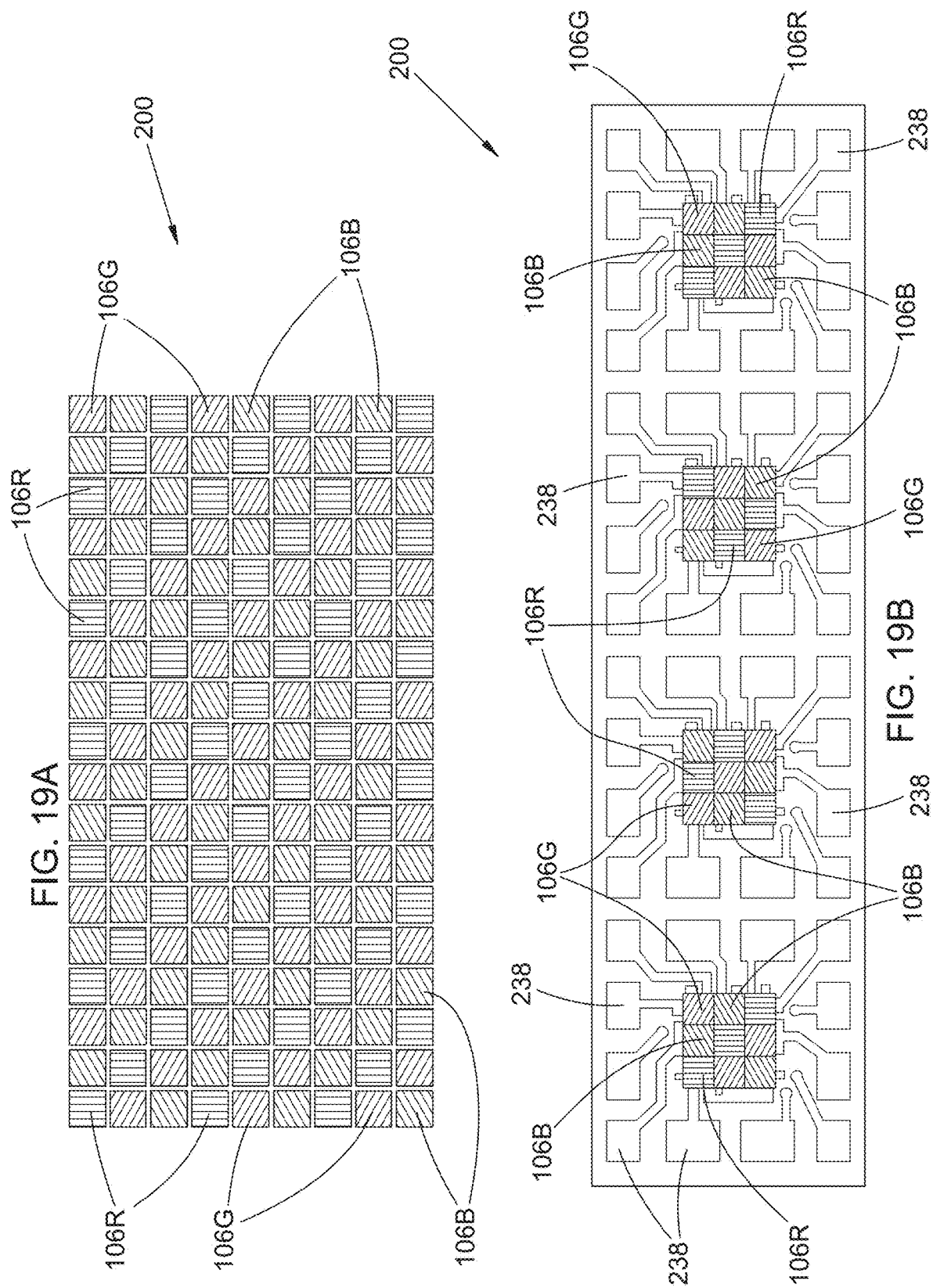

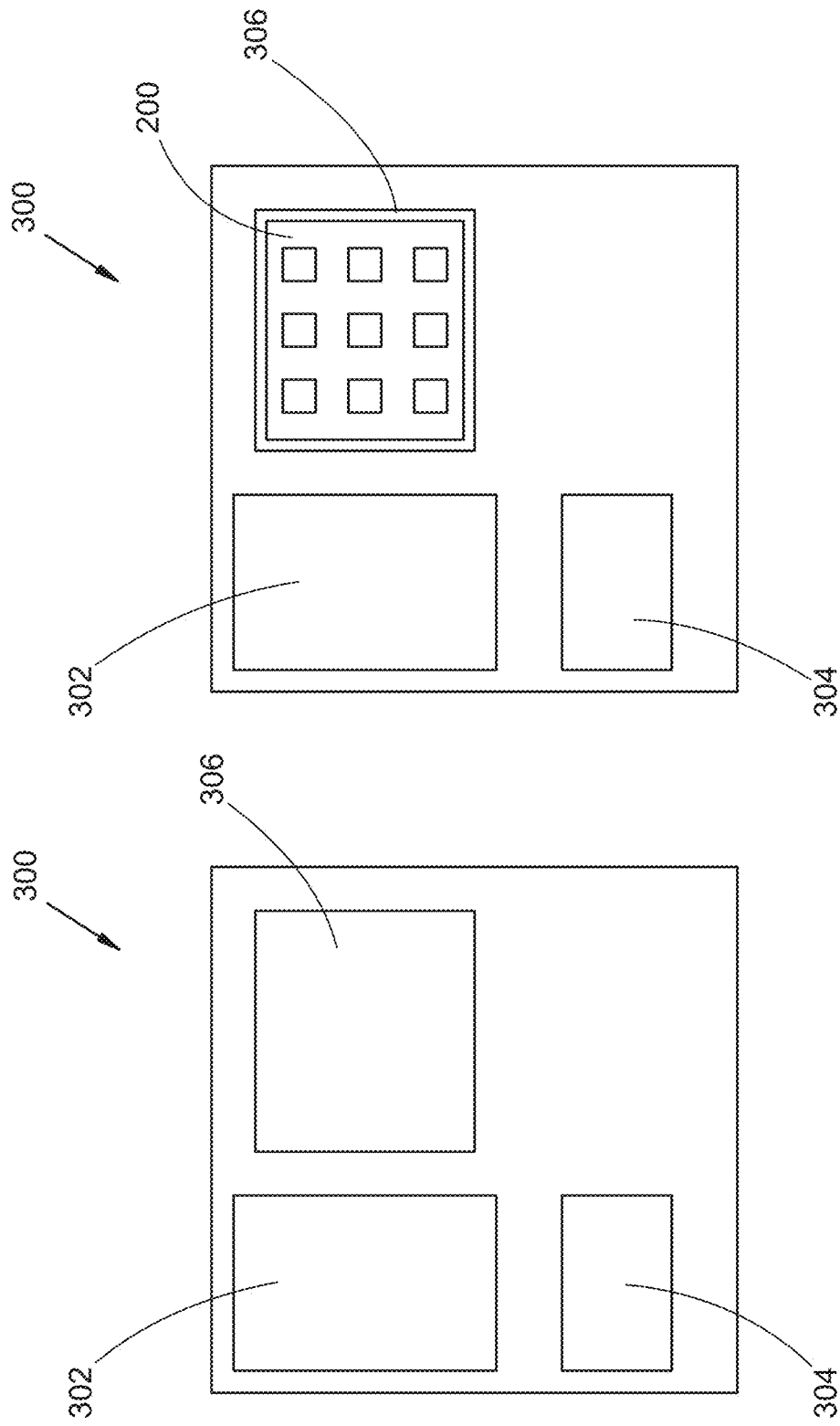

LIGHT-EMITTING DEVICE ASSEMBLY WITH EMITTER ARRAY, MICRO- OR NANO-STRUCTURED LENS, AND ANGULAR FILTER

BENEFIT CLAIMS TO RELATED APPLICATIONS

This application is a continuation-in-part of U.S. non-provisional application Ser. No. 17/182,005 entitled "Light-emitting device assembly with emitter array, micro- or nano-structured lens, and angular filter" filed Feb. 22, 2021 in the names of Lopez et al (now U.S. Pat. No. 11,204,153), said application being incorporated herein by reference in its entirety.

FIELD OF THE INVENTION

The field of the present invention relates to light-emitting device assemblies. Assemblies are disclosed herein that include an emitter array, a micro- or nano-structured lens, and an angular filter.

BACKGROUND

In some illumination applications, it may be desirable to generate different spatial illumination patterns. An array of emitters (e.g., an array of LEDs or pcLEDs) can be imaged into an image plane in the far field. Selective activation of different emitters of the array results in corresponding different spatial illumination patterns. In some instances (e.g., camera flash in a mobile device), significant size constraints make such far-field imaging problematic, due to the size of the optical elements that may be required for far-field imaging. In some instances those optical elements may be inefficient or lossy.

In addition, typical light-emitting diodes emit radiation as an output beam with an angular intensity distribution that is roughly Lambertian (i.e., having intensity that varies as cos $\theta$, where $\theta=0°$ defines the primary beam propagation direction, which in many examples is normal to the surface of the emitter). For many practical applications such an intensity distribution is too wide, with an unacceptably high fraction of the total optical output power propagating at angles too far from the primary beam direction to be useful. In particular, in the illumination applications described above, such a Lambertian intensity distribution can result in a significant fraction of the LED output not being collected by the imaging optics.

SUMMARY

An inventive light-emitting device assembly comprises an emitter array of light-emitting elements, a substrate, a structured lens, and an angular filter. The emitter array emits output light from its emission surface. The emitter array enables selective activation of individual elements of the array or different subsets of elements of the array, and corresponding selective emission of output light from the activated elements. The substrate is substantially transparent and positioned so that output light is transmitted through the substrate.

The structured lens is formed on or in the substrate, and comprises micro- or nano-structured elements arranged so that the structured lens is characterized by an effective focal length; that effective focal length is less than an effective distance between the structured lens and the emission surface of the emitter array. The angular filter is positioned on or in the substrate or on the emission surface of the emitter array; the angular filter exhibits incidence-angle-dependent optical transmission that decreases with increasing angle of incidence or that has a cutoff angle of incidence above which optical transmission is substantially prevented.

Far-field imaging of the emitter array by the structured lens can result in a corresponding far-field illumination pattern. Selective activation of different subsets of individual elements of the array can result in different corresponding far-field illumination patterns.

The micro- or nano-structured surface elements of the structured lens can include a multitude of suitably sized and shaped projections, holes, depressions, inclusions, structures formed on or in the substrate, an array of nano-antennae, a partial photonic bandgap structure, a photonic crystal, or an array of meta-atoms or meta-molecules. Those elements can be arranged so as to collectively impart on the output light a transverse-position-dependent phase delay that results in the effective focal length of the structured lens. The angular filter can include an array of nano-antennae, a partial photonic bandgap structure, a photonic crystal, an array of meta-atoms or meta-molecules, or a multi-layer dielectric thin film. The angular filter can be further arranged to result in transmissive redirection of output light to propagate at an angle less than its incident angle.

Objects and advantages pertaining to light-emitting device assemblies may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 4A and 4B illustrate schematically an example of a phase function imparted by an example of a structured lens of an inventive light-emitting device assembly.

FIGS. 6A through 6D are plots illustrating incidence-angle-dependent reflectance or transmission exhibited by examples of an angular filter of an inventive light-emitting device assembly.

FIGS. 9A and 9B illustrate schematically transmissive redirection of light, by an example of an angular filter of an inventive light-emitting device assembly, to propagate at an angle less than the refracted angle or less than the incidence angle, respectively.

FIGS. 10A and 10B illustrate schematically simulated angular intensity distributions for an array of light-emitting elements without and with an angular filter, respectively.

FIG. 12A illustrates schematically selective activation of light-emitting elements of an array of an inventive light-emitting device assembly. FIGS. 12B, 12C, and 12D are simulations of images formed with the effective distance between the array and the structured lens greater than, about equal to, and less than, respectively, the effective focal length of the structured lens.

FIG. 13A illustrates schematically selective activation of light-emitting elements of an array of an inventive light-emitting device assembly. FIGS. 13B and 13C are simulations of images formed with space between the array and the structured lens filled with air and silicone, respectively.

FIG. 15 shows a schematic cross-sectional view of an example pcLED.

FIGS. 16A and 16B show, respectively, cross-sectional and top schematic views of an example array of pcLEDs.

FIG. 17A shows a schematic cross-sectional view of an example array of pcLEDs arranged with respect to waveguides and a projection lens. FIG. 17B shows an arrangement similar to that of FIG. 17A, but without the waveguides.

FIG. 19A is a schematic top view of a portion of an example LED display in which each display pixel is a red, green, or blue phosphor-converted LED pixel. FIG. 19B is a schematic top view of a portion of an example LED display in which each display pixel includes multiple phosphor-converted LED pixels (red, green, and blue) integrated onto a single die that is bonded to a control circuit backplane.

FIG. 20A shows a schematic top view an example electronics board on which an array of pcLEDs may be mounted, and FIG. 20B similarly shows an example array of pcLEDs mounted on the electronics board of FIG. 20A.

Figure 1:
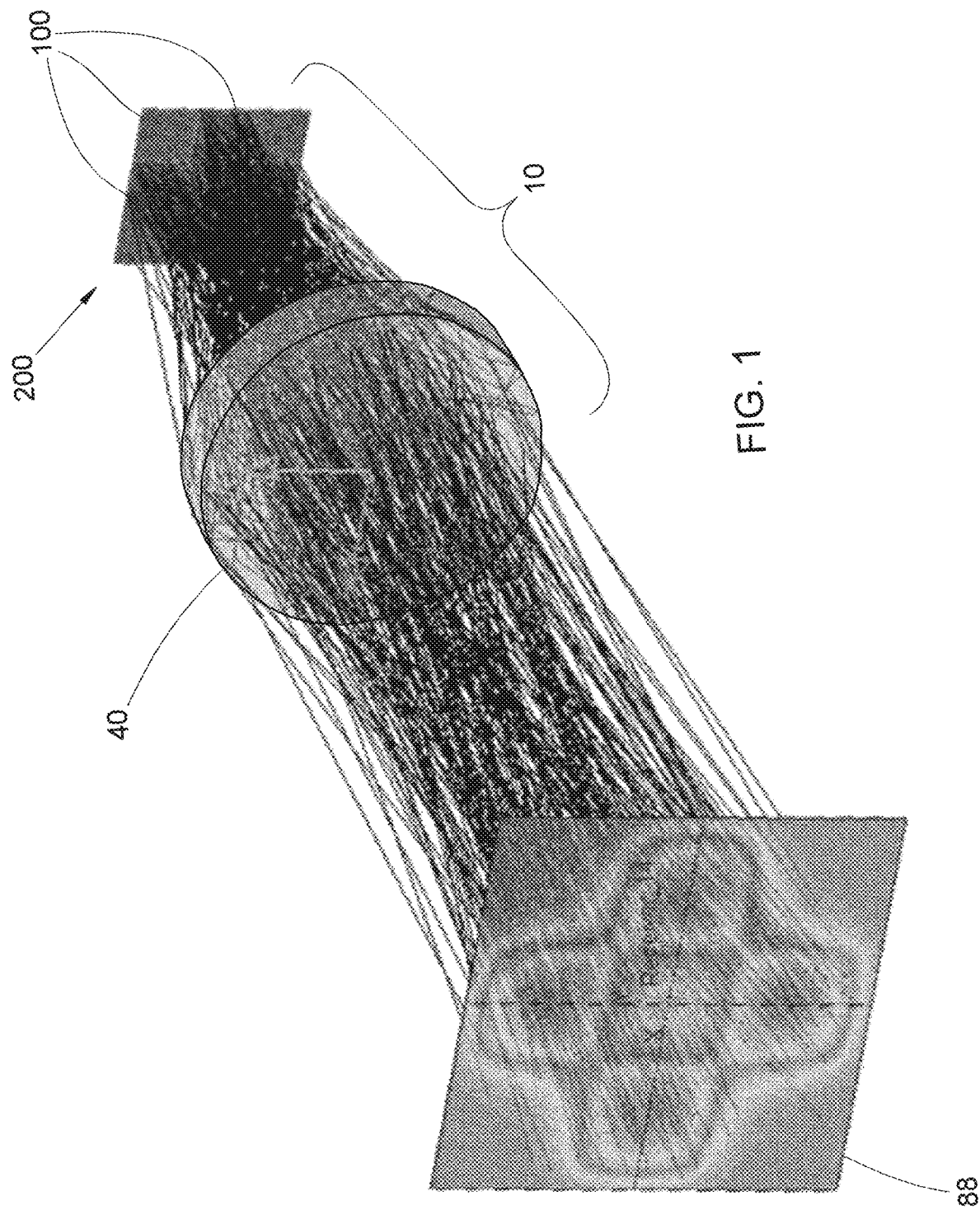
FIG. 1 illustrates schematically an image of an array of light-emitting elements formed by a focusing element.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. In particular, the height, depth, or width of various elements often can be exaggerated relative to other elements or, e.g., the thickness of an underlying substrate. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the disclosed inventive subject matter. The detailed description illustrates inventive subject matter by way of example, not by way of limitation.

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths. In some instances the light emitted by the LED is used as the output of a device; such LEDs can be referred to as direct emitters.

In other instances LEDs can be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a µLED array). Such mini- or microLED arrays can in many instances also include phosphor converters as described above; such arrays can be referred to as pc-miniLED or pc-microLED arrays.

FIG. 15 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. A direct-emitter LED would lack the wavelength converting structure 106. As employed hereinafter, the term "LED" shall refer generically to either or both direct-emitter LEDs and pcLEDs.

The semiconductor diode structure 102 typically comprises a junction or active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, arsenic, other III-V materials, or various II-VI materials.

Any suitable phosphor materials may be used for or incorporated into the wavelength converting structure 106, depending on the desired optical output from the pcLED.

FIGS. 16A and 16B show, respectively, cross-sectional and top views of an array 200 of pcLEDs 100, each including a phosphor pixel 106, disposed on a substrate 204. Generally an array can include any suitable number of direct-emitter LEDs and/or pcLEDs arranged in any suitable manner. In the illustrated example the array is depicted as formed monolithically on a shared substrate, but alternatively an array can be formed from separate individual LEDs and/or pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Individual LEDs and/or pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, an LED or pcLED array 200 (for example, mounted on an electronics board) can be arranged in combination with secondary optical elements such as waveguides, lenses, or both for use in an intended application. In FIG. 3A, light emitted by each LED or pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by LEDs and/or pcLEDs of the array 200 is collected directly by projection lens 294 without use of intervening waveguides. This arrangement may particularly be suitable when LEDs and/or pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the LEDs or pcLEDs described herein, depending on the desired application.

Figure 18A:
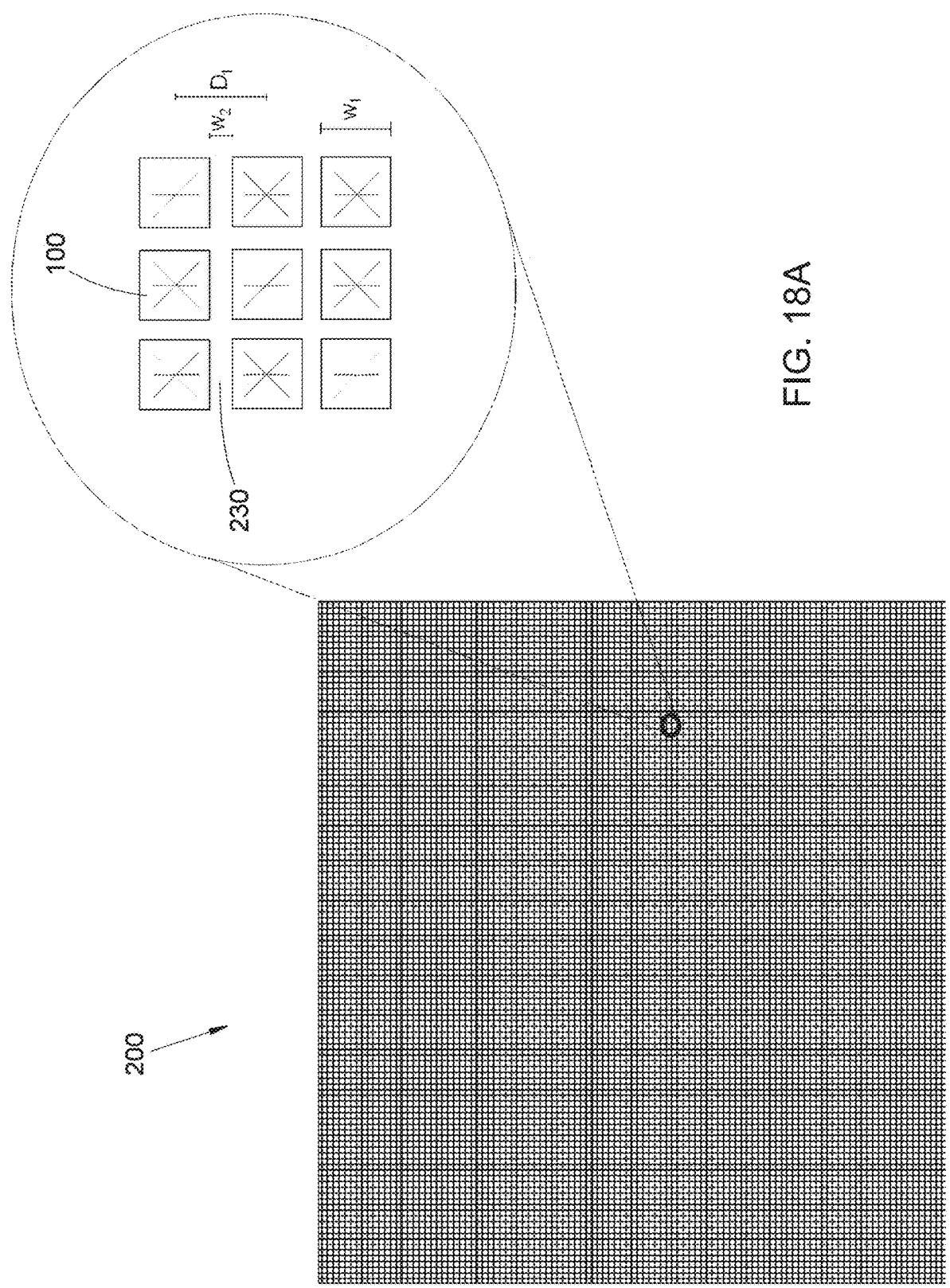
FIG. 18A shows a top schematic view of an example miniLED or microLED array and an enlarged section of 3×3 LEDs of the array.

Although FIGS. 16A and 16B show a 3×3 array of nine pcLEDs, such arrays may include for example on the order of $10^1$, $10^2$, $10^3$, $10^4$, or more LEDs and or pcLEDs, e.g., as illustrated schematically in FIG. 18A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 18B:
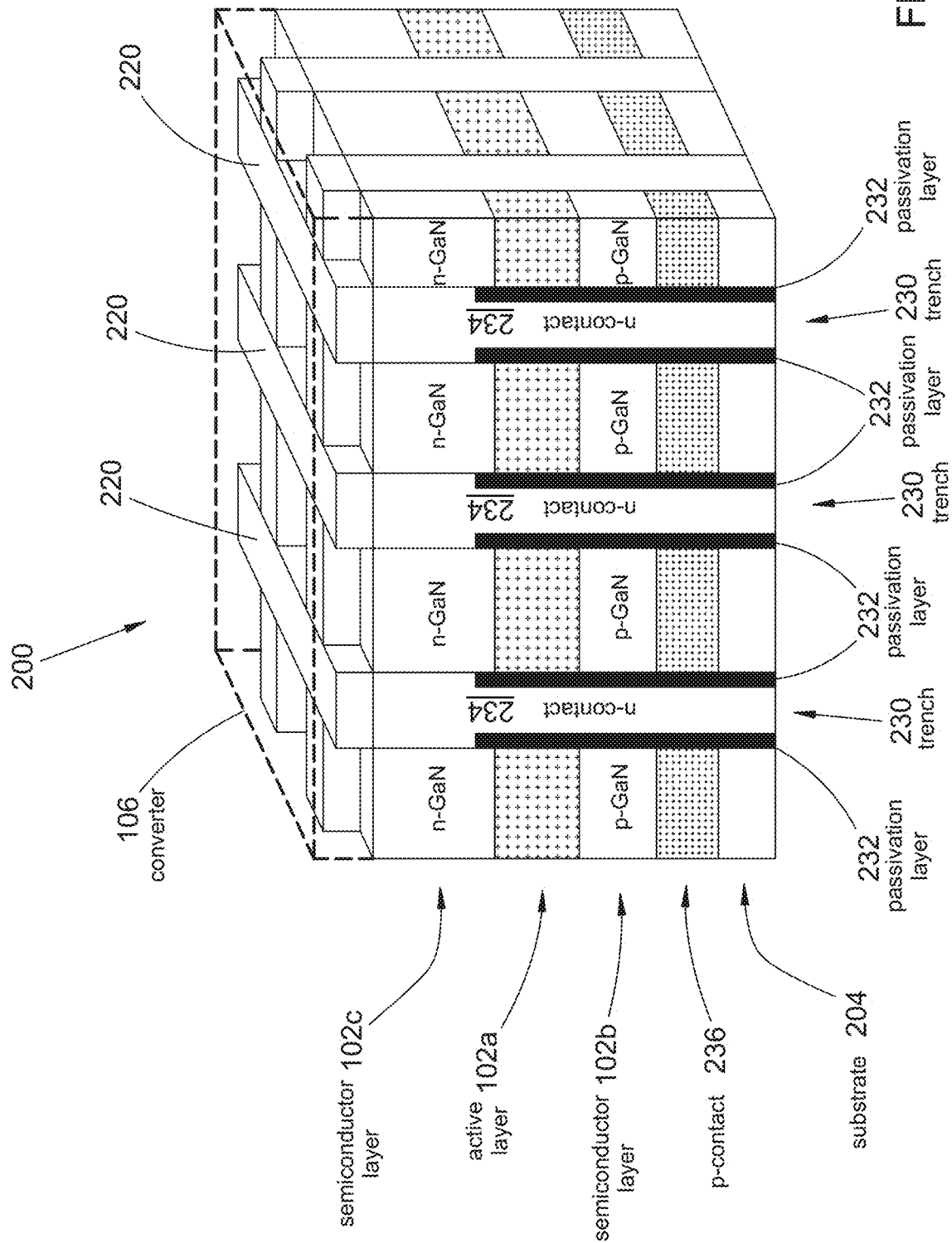
FIG. 18B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 18B shows a perspective view of an example of such a segmented monolithic pcLED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 18C:
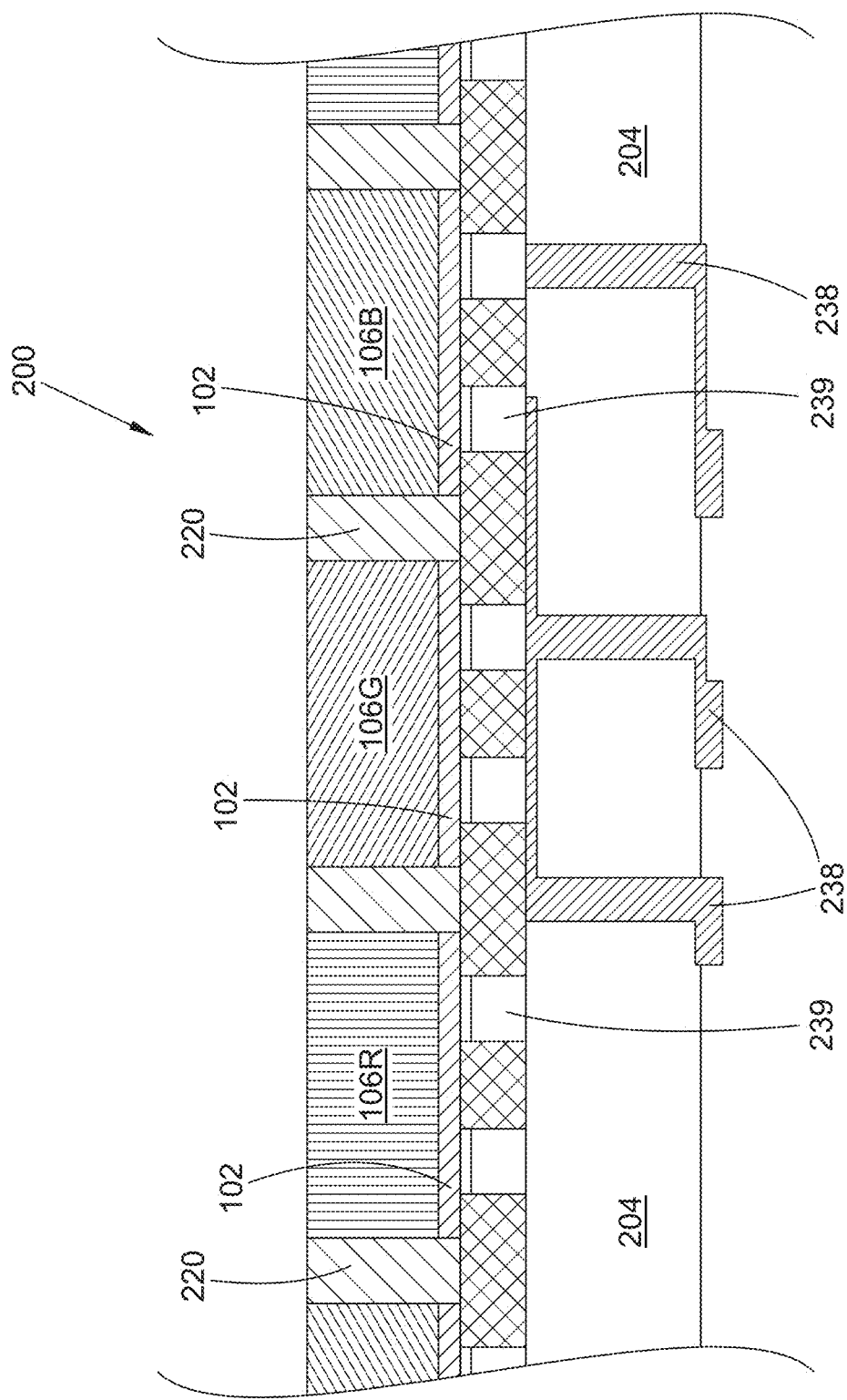
FIG. 18C is a side cross-sectional schematic diagram of an example of a close-packed array of multi-colored phosphor-converted LEDS on a monolithic die and substrate.

FIG. 18C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 absorbs light emitted by the LEDs 102 (e.g., UV light) and emits one of three different colors, e.g., red phosphor pixels 106R, green phosphor pixels 106G, and blue phosphor pixels 1066 (still referred to generally or collectively as phosphor pixels 106). Such an arrangement can enable use of the LED array 200 as a color display. In an alternative arrangement (not shown), the LEDs can emit blue light, phosphors 106G and 106R can be employed to emit green and red output light, and the phosphor 106B can be omitted so that direct emission of some of the LEDs 102 provides blue output light. Many other arrangements employing any suitable or desirable numbers of LEDs or pcLEDs producing any suitable number and wavelengths of different colors can be employed.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 19A and 19B are examples of LED arrays 200 employed in display applications, wherein an LED display includes a multitude of display pixels. In some examples (e.g., as in FIG. 19A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 19B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106. Any of the arrangements of FIGS. 19A and 19B can be adapted to include direct-emitting LEDs, instead of or in addition to pcLEDs.

As shown in FIGS. 20A and 20B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

A general arrangement of an inventive light-emitting device assembly 10 is illustrated schematically in FIG. 1, and includes at least an emitter array 200 of multiple light-emitting elements 100 and a focusing element 40. The individual elements 100 of the emitter array 200 can be all the same or can differ from one another, can include LEDs or pcLEDs or both, and can be selectively activated so as to produce selective emission from the activated elements 100. The focusing element 40 is characterized by an effective focal length and is positioned so that an effective distance between the emitter array 200 and the focusing element is greater than the effective focal length. The real image 88 thus formed (of the emitter array 200) constitutes a far-field illumination pattern that illuminates a desired area or scene. Altering the subset of activated elements 100 of the emitter array 200 results in corresponding alteration of the far-field illumination pattern.

Figure 2:
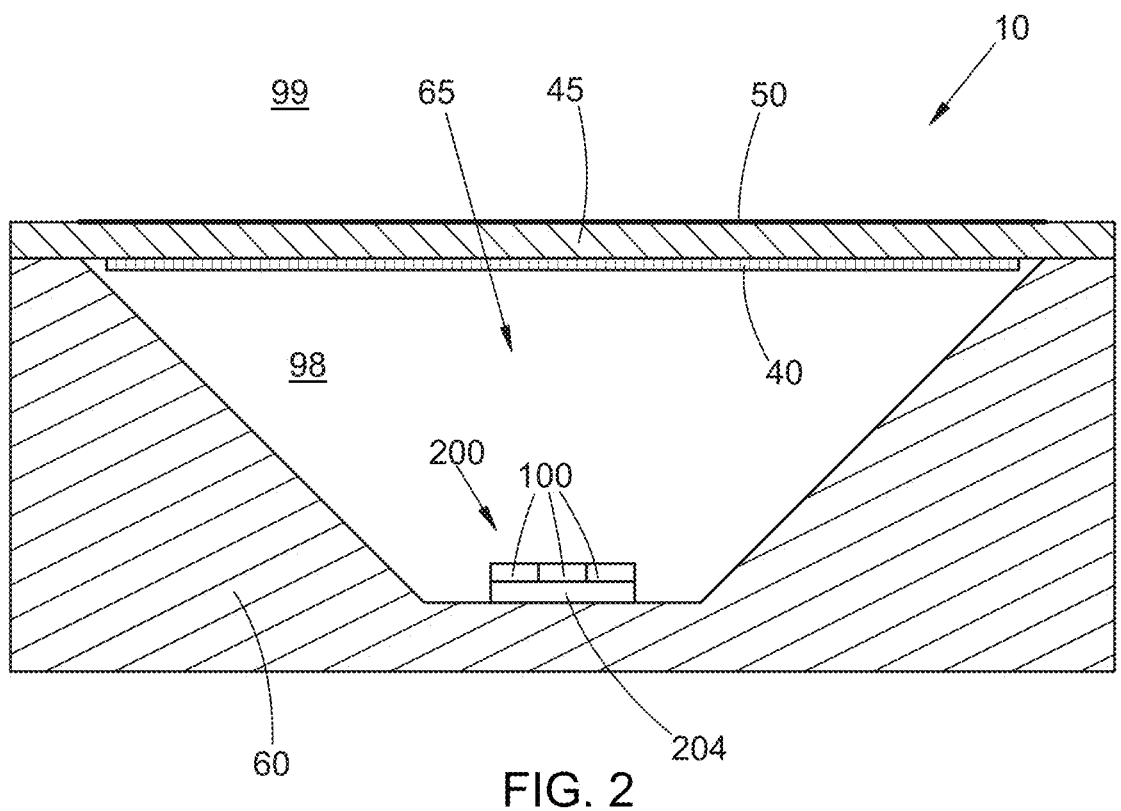
FIG. 2 is a schematic side cross-sectional view of a first example of an inventive light-emitting device assembly.
Figure 3:
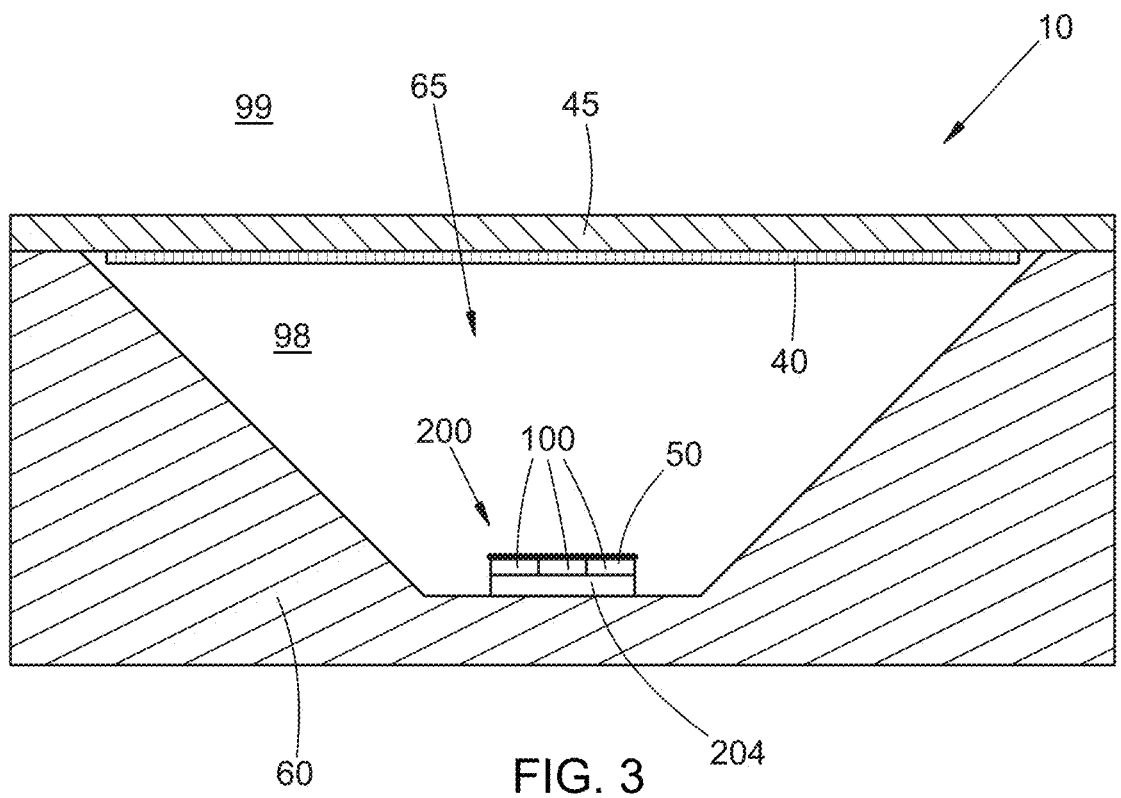
FIG. 3 is a schematic side cross-sectional view of a second example of an inventive light-emitting device assembly.

It would be desirable to provide an inventive light-emitting device assembly that provides a far-field image of a light-emitting array in a more compact form, or with a higher fraction of light output of the array directed to form the image. Accordingly, FIGS. 2 and 3 illustrate schematically examples of an inventive light-emitting device assembly 10 that comprises an emitter array 200 of light-emitting elements 100, a substrate 45, a structured lens 40 (the focusing element described above), and an angular filter 50. The emitter array 200 emits from its emission surface output light that is transmitted through the substrate 45, which is substantially transparent. The assembly can also include an optical collector 60 (e.g., as in the examples of FIGS. 2 and 3) that is concave and has a collector cavity 65 with an open output end. In such examples the emitter array 200 can be positioned within the collector cavity 65 and the substrate 45 can be positioned across the open output end of the collector cavity 65, so that output light exits the cavity 65 from the open end. A fill medium 98 (typically ambient air or inert gas) can fill the volume between the emitter array 200 and the substrate 45 (enclosed by the collector cavity 65 and the substrate 45 in examples that include an optical collector 60). Exiting output light is transmitted through the fill medium 98 and the substrate 45 to propagate through a surrounding medium 99 (typically ambient air).

The structured lens 40 is formed on or in the substrate 45, and comprises micro- or nano-structured elements arranged so that the structured lens 40 is characterized by an effective focal length (described further below); that effective focal length (e.g., at a nominal output vacuum wavelength $\lambda_0$) is less than an effective distance between the structured lens 40 and the emission surface of the emitter array 200. The angular filter 50 is positioned on or in the substrate 45 (as in FIG. 2) or on the emission surface of the emitter array (as in FIG. 3); the angular filter 50 exhibits incidence-angle-dependent optical transmission that decreases with increasing angle of incidence or that has a cutoff angle of incidence above which optical transmission is substantially prevented (described further below).

Far-field imaging of the emitter array 200 by the structured lens 40 can result in a corresponding far-field illumination pattern (e.g., the image 88). Selective activation of different subsets of individual elements 100, or different subsets of elements 100, of the emitter array 200 can result in different corresponding far-field illumination patterns. That capability can be advantageously employed, e.g., for altering automotive headlight beams in response to oncoming vehicles, or curves or hills in a roadway, or altering a camera flash in response to facial recognition to reduce or avoid red-eye, or for other adaptive illumination applications (e.g., an adaptive torch).

In some examples (e.g., FIG. 2), the structured lens 40 and the angular filter 50 are both positioned on the substrate 45, typically on or near respective opposite surfaces of the substrate 45. In some of those examples, the structured lens 40 is positioned on the surface of the substrate 45 that faces the emitter array 200, and the angular filter 50 is positioned on the surface of the substrate 45 that faces away from the emitter array 200. In some other examples (e.g., FIG. 3), the structured lens 40 is positioned on a surface of the substrate 45, and the angular filter 50 is positioned on the emission surface of the emitter array 200.

Figure 5A:
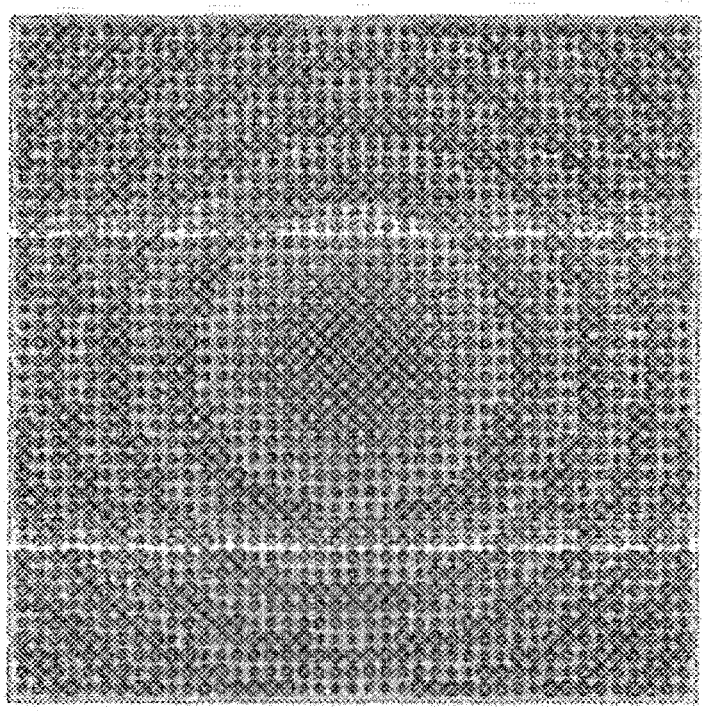
FIGS. 5A, 5B, and 5C are top, perspective, and enlarged views, respectively, of an example of a structured lens of an inventive light-emitting device assembly.
Figure 5B:
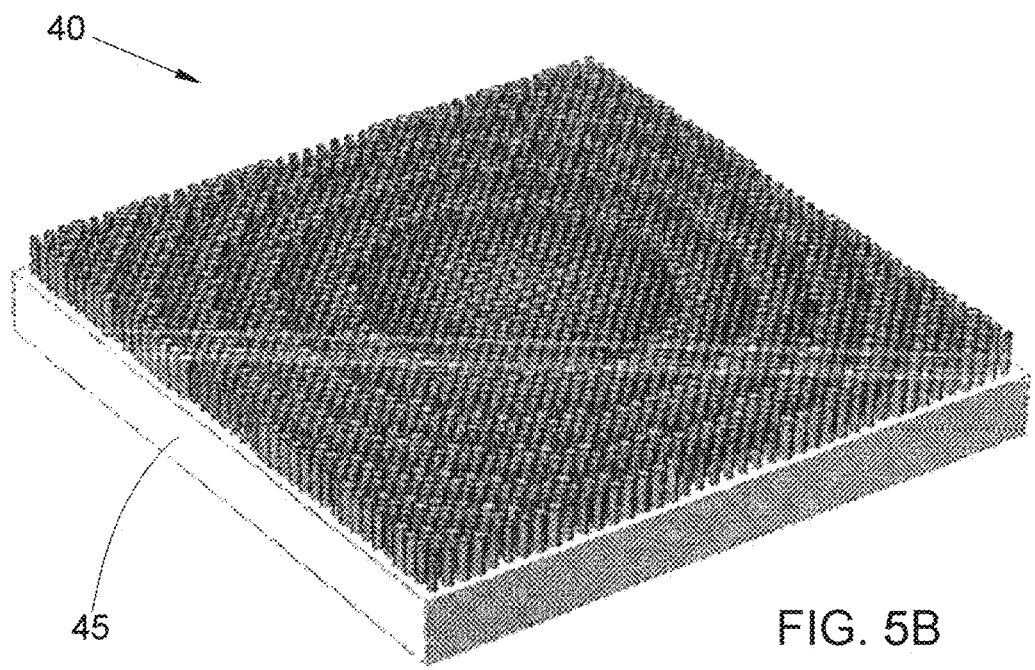
Figure 5C:
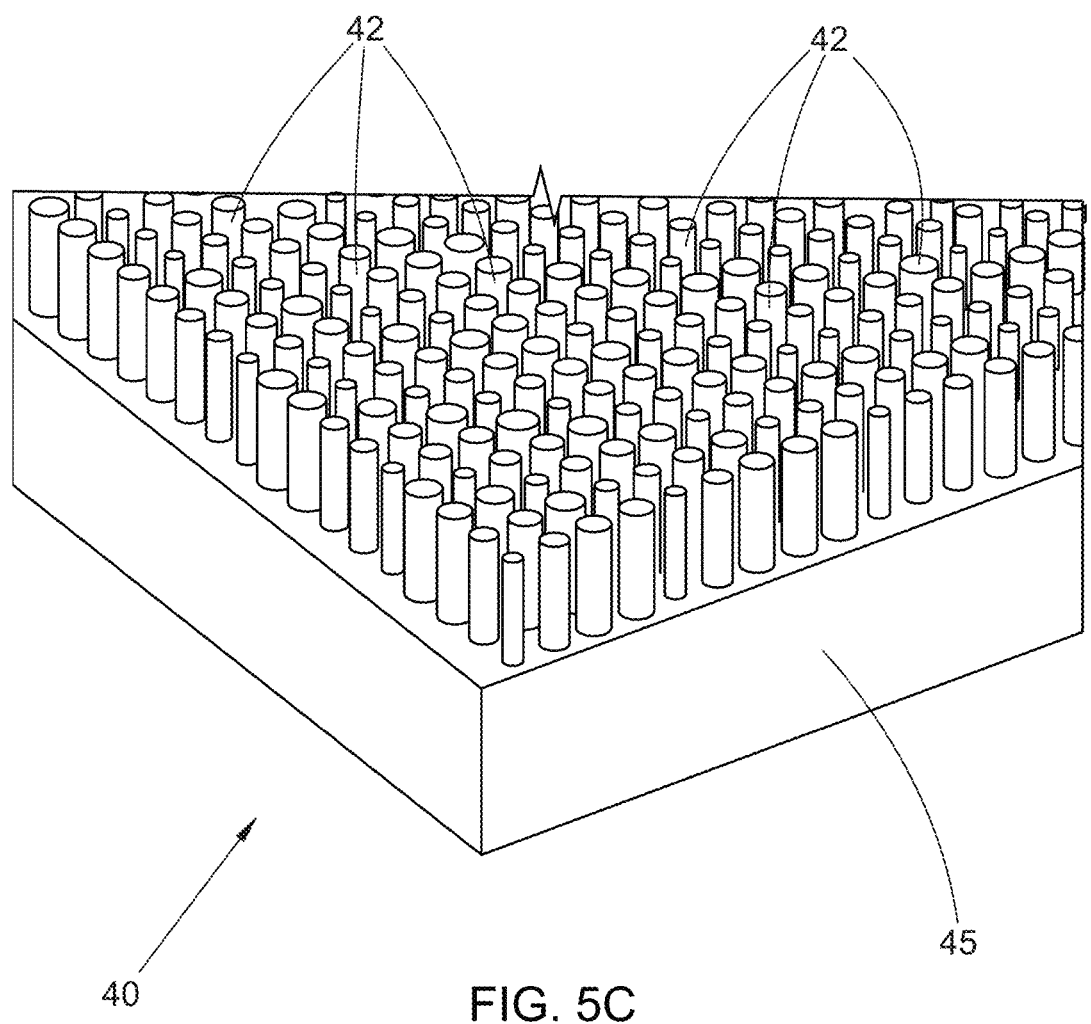
Figure 7A:
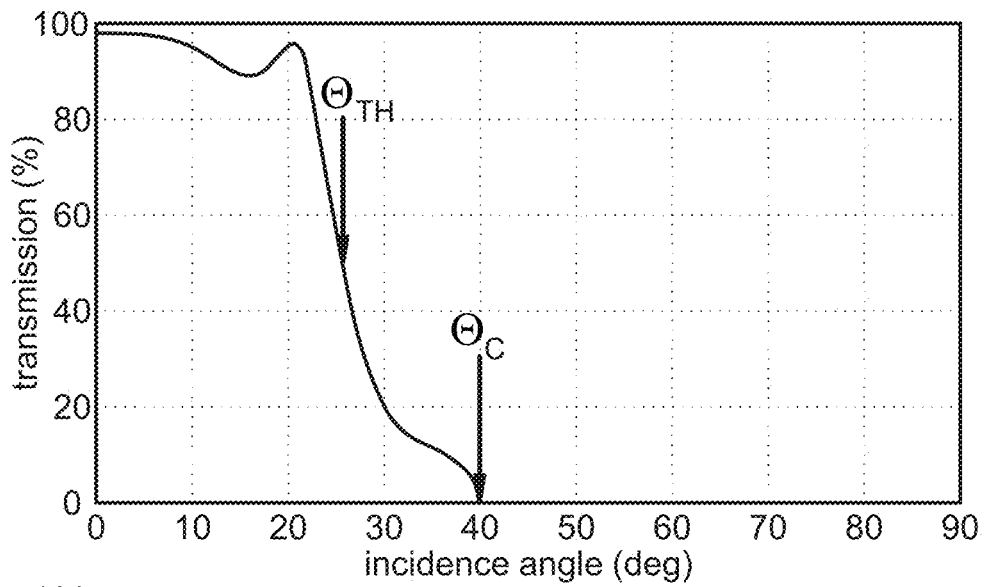
FIGS. 7A through 7C are plots illustrating incidence-angle-dependent transmission exhibited by examples of an angular filter of an inventive light-emitting device assembly.
Figure 7B:
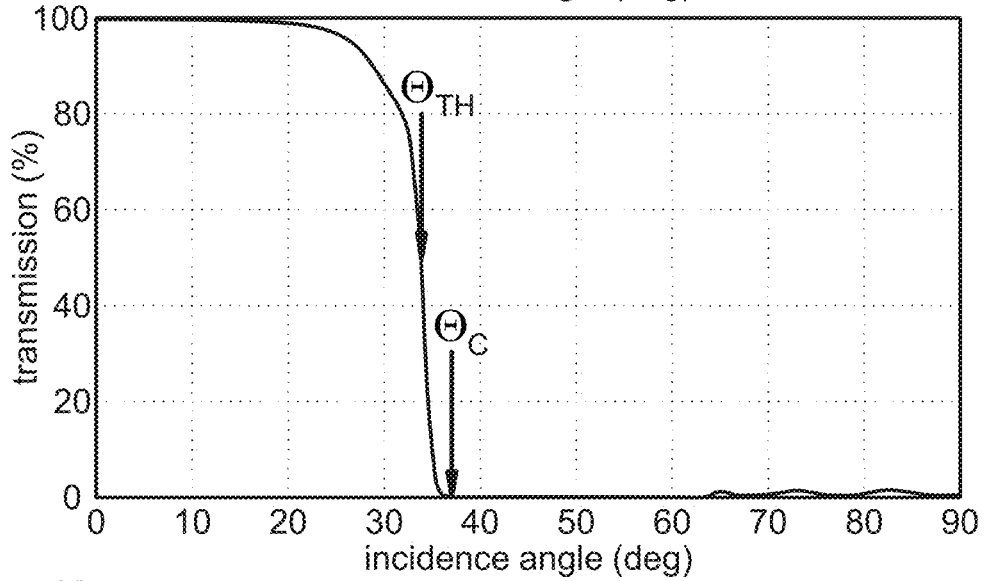
Figure 7C:
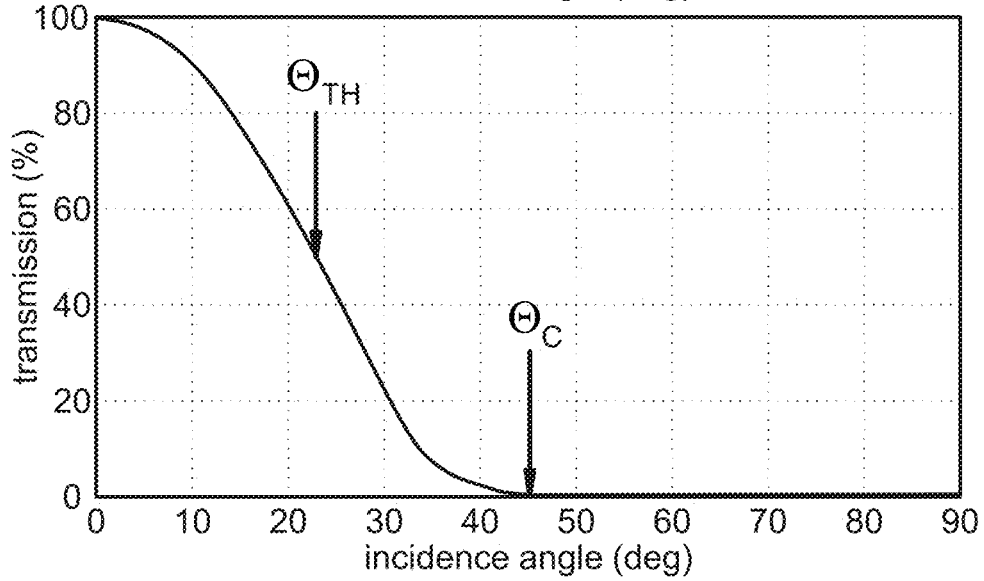

The micro- or nano-structured elements 42 of the structured lens 40 (sometimes referred to as a "metalens") can include a multitude of suitably sized and shaped projections, holes, depressions, inclusions, or structures formed on or in the substrate 45, in some examples as, e.g., an array of nano-antennae, a partial photonic bandgap structure, a photonic crystal, or an array of meta-atoms or meta-molecules. Those micro- or nano-structured elements 42 can be arranged so as to collectively impart on the output light a transverse-position-dependent phase delay that results in the effective focal length of the structured lens 40. In some examples, to approximate a simple spherical lens, a quadratic phase function can be employed. An example phase function is illustrated schematically in FIGS. 4A and 4B. FIGS. 5A, 5B, and 5C illustrate schematically an example of a structured lens 40 wherein the nano- or micro-structured elements are cylindrical columns 42 of varying diameters positioned on the surface of the substrate 45. The columns 42 can extend into the fill medium 98 or the surrounding medium 99, depending on which surface of the substrate 45 carries the columns 42. Average fractional area occupied by the columns 42 varies across the substrate 45 so that the columns collectively impart the desired phase function and effective focal length. That example and others are disclosed in U.S. Patent Pub. No. 2019/0113727 entitled "Nanostructured meta-materials and meta-surfaces to collimate light emissions from LEDs" published Apr. 18, 2019 in the name of Venkata Ananth Tamma (now U.S. Pat. No. 10,996,451); that published application, the issued patent, and the references cited therein are incorporated by reference as if set forth herein in their entireties.

In some examples of a structured lens 40, the micro- or nano-structured elements 42 of the structured lens 40 can include one or more of an array of nano-antennae, a partial photonic bandgap structure, a photonic crystal, or an array of meta-atoms or meta-molecules. Some examples are illustrated schematically in FIGS. 11A-11D. Those elements 42 can be positioned on a surface of the substrate 45 or within the substrate 45. If positioned on a surface of the substrate 45, the elements 42 can extend into the fill medium 98 or the surrounding medium 99, depending on which surface of the substrate 45 carries the elements 42. Whatever their type or structure, the elements 42 can be arranged to collectively impart on the output light a transverse-position-dependent phase delay that results in the desired effective focal length of the structured lens. In some examples the elements 42 can be formed, deposited, or grown, in any suitable way employing any suitable materials, directly on or in the substrate 45; in other examples, the elements 42 can be formed, in any suitable way employing any suitable materials, as a separate structure or layer that is attached or applied to a surface of the substrate 45.

In some examples the micro- or nano-structured elements 42 of the structured lens 40 can include an array of single nano-antennae, or double nano-antennae (i.e., dimers), that can (i) include one or more antenna materials, (ii) be shaped, sized and spaced relative to a nominal output vacuum wavelength $\lambda_O$, and (iii) be arranged along the substrate surface, so as to reradiate, upon irradiation by the output light, at least a portion of the output light so as to result collectively in the effective focal length of the structured lens 40. In some examples the micro- or nano-structured elements 42 of the structured lens 40 can include a partial photonic bandgap structure arranged with one or more materials, morphology, and spacing relative to a nominal output vacuum wavelength $\lambda_O$, so as to redirect, upon irradiation by the output light, at least a portion of the output light so as to result in the effective focal length of the structured lens 40. In some examples the micro- or nano-structured elements 42 of the structured lens 40 can include a photonic crystal arranged with one or more materials, crystal morphology, and crystal-lattice spacing relative to a nominal output vacuum wavelength $\lambda_O$, so as to redirect, upon irradiation by output light, at least a portion of the output light so as to result in the effective focal length of the structured lens 40. In some examples the micro- or nano-structured elements 42 of the structured lens 40 can include an array of meta-atoms or meta-molecules that can (i) include one or more meta-materials, (ii) be shaped, sized, and spaced relative to a nominal output vacuum wavelength $\lambda_O$, and (iii) be arranged along the substrate, so as to reradiate, upon irradiation by the output light, at least a portion of the output light so as to result collectively in the effective focal length of the structured lens.

To form a desired illumination pattern (i.e., the image 88), the structured lens 40 is positioned so that the emission surface of the emitter array 200 is separated from the structured lens 40 by a distance that is greater that the effective focal length of the structured lens 40. FIG. 12A illustrates schematically an emission pattern produced by the emitter array 200. FIG. 12B is a simulated image 88 formed with the effective distance between the structured lens 40 and the emitter array 200 greater than the effective focal length of the structured lens 40. The corresponding far-field illumination pattern approximates the emission pattern of the emitter array 200, enabling control over that illumination pattern. The simulated image 88 of FIG. 12C results from positioning the emitter array 200 at an effective distance about equal to the effective focal length; the image 88 of FIG. 12C is beginning to defocus, degrading the correspondence between the far-field illumination pattern and the emission pattern of the emitter array 200. The simulated illumination pattern of FIG. 12D results from less than the effective focal length separating the structured lens 40 from the emitter array 200; no real image is formed, and there is little or no meaningful control over the illumination pattern by altering the emission pattern of the array 200.

To provide control over the far-field illumination pattern, the effective distance between the emitter array 200 and the structured lens 40 should be farther than the effective focal length of the structured lens 40. With respect to the focusing properties of the assembly 10, the "effective distance" is the actual distance divided by the refractive index of the intervening medium 98. For a given actual distance between the array 200 and lens 40, the effective distance increases with decreasing refractive index, and is a maximum when the fill medium 98 has a refractive index of about one. Accordingly, to provide the most compact assembly 10, in some examples ambient air or inert gas or vacuum can be employed as the fill medium 98. FIG. 13A illustrates schematically an emission pattern produced by the emitter array 200. FIG. 13B is a simulated image 88 formed with actual separation between the array 200 and the lens 40 being only slightly longer than the focal length and with air as the fill medium 98. The simulated illumination pattern of FIG. 13C results from the same separation but with silicone as the fill medium 98. The effective focal length is now greater than the effective distance between the array 200 and the lens 40, no real image is formed, and there is little or no meaningful control over the illumination pattern by altering the emission pattern of the array 200.

In other examples (e.g., if compactness is not such a stringent requirement), a substantially transparent liquid or solid fill medium 98 can be employed, with a correspondingly larger separation between the lens 40 and the array 200. In some of those examples, a silicone fill medium 98 can be employed. In some instances a higher-index fill medium 98 can be advantageous with respect to extracting output light from the emitter array 200.

The position and arrangement of the structured lens 40 described above enables desired illumination patterns to be generated and projected onto an area or scene. As noted above, the typical Lambertian output profile of many LEDs and pcLEDs (e.g., angular profile 71 of FIG. 6A) results in an unacceptably high fraction of the total optical output power propagating at angles that are not collected by the lens 40. The angular filter 50 of the inventive light emitting device assembly 10 results in a narrower emission profile (e.g., angular profile 72 of FIG. 6A) that increases the fraction of LED output light that is collected by the structured lens 40 and projected into the far-field illumination pattern.

The angular filter 50 is arranged to exhibit incidence-angle-dependent optical transmission of the output light that decreases with increasing angle of incidence or that has a cutoff angle of incidence above which optical transmission is substantially prevented. The angular filter 50 can include an array of nano-antennae, a partial photonic bandgap structure, a photonic crystal, an array of meta-atoms or meta-molecules, or a multi-layer dielectric thin film. Examples of nano- or micro-structured elements 52 that can be employed are illustrated schematically in FIGS. 11A through 11D. Note that the elements 42 and 52 can be selected from among some of the same general element types, but in a given assembly 10 typically will differ from one another with respect to type, composition, or arrangement. If the angular filter 50 is positioned on the substrate 45 (e.g., as in FIG. 2), then the elements 52 can extend into the surrounding medium 99 or into the fill medium 98, depending on which surface of the substrate 45 carries the elements 52. If the angular filter 50 is positioned on the emitter array 200 (e.g., as in FIG. 3), then the elements 52 can extend from the surface of the array 200 into the fill medium 98 (not shown). Whatever their type or structure, the elements 52 can be arranged to impart on the output light the desired incidence-angle-dependent transmission. In some examples the elements 52 can be formed, deposited, or grown, in any suitable way employing any suitable materials, directly on or in the substrate 45 or on the emitter array 200; in other examples, the elements 52 can be formed, in any suitable way employing any suitable materials, as a separate structure or layer that is attached or applied to a surface of the substrate 45 or the emitter array 200.

Figure 8A:
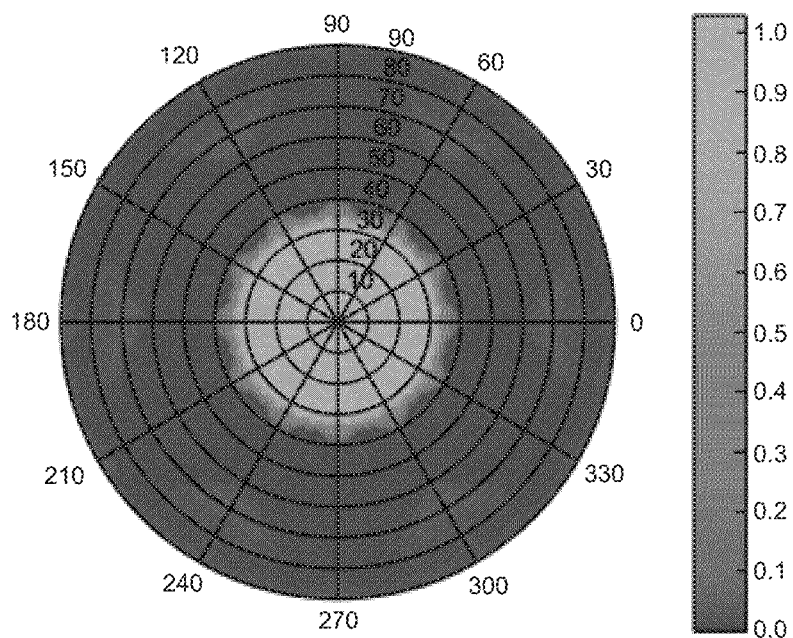
FIGS. 8A and 8B are plots illustrating incidence-angle-dependent transmission and reflectance, respectively, exhibited by an example of an angular filter of an inventive light-emitting device assembly.
Figure 8B:
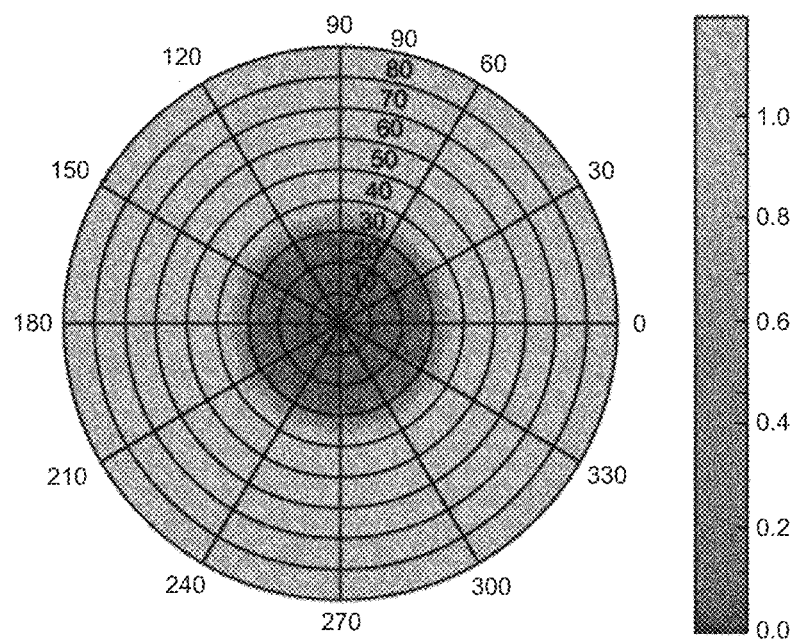
Figure 11A:
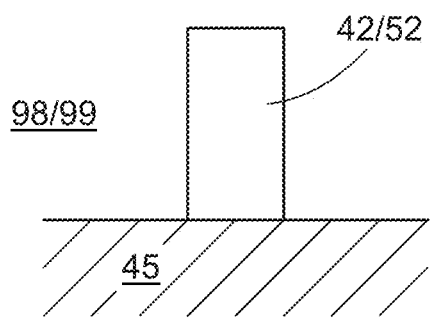
FIGS. 11A through 11D illustrate schematically several examples of nano-antennas of examples of an angular filter of an inventive light-emitting device assembly.
Figure 11B:
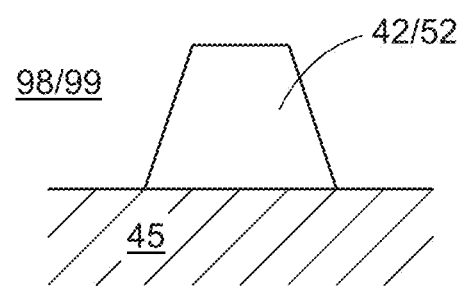
Figure 11C:
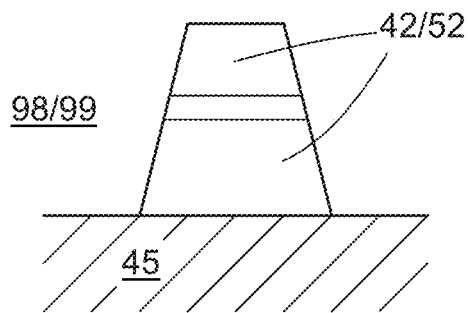
Figure 11D:
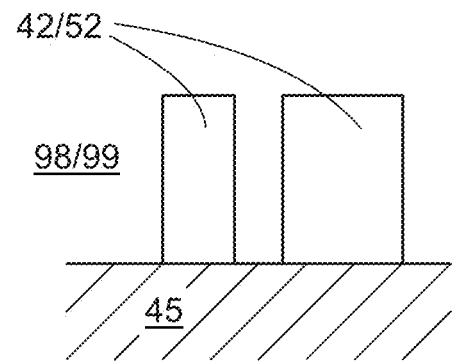

Whatever the structural arrangement or location employed for the angular filter 50, in some examples the incidence-angle-dependent transmission can be characterized by a half-transmission angle $\Theta_{TH}$ (i.e., the incidence angle at which transmission through the light-escape surface 40 drops to about 50%). Instead, or in addition, in some examples the incidence-angle-dependent transmission can be characterized by a cut-off angle $\Theta_C$ (i.e., the incidence angle above which there is no transmission, or only negligible transmission, through the light-escape surface 40). Some examples of suitable incidence-angle-dependent transmission (or reflection), with the angles $\Theta_{TH}$ and $\Theta_C$ labelled, are shown in FIGS. 6B and 7A-7C. Generally, for a given light-emitting device 20 and optical collector 30, decreasing the half-transmission angle $\Theta_{TH}$ or cut-off angle $\Theta_C$ of the angular filter 50 results in increasing fraction of the output light form the emitter array 200 being projected onto the image 88. Another example of incidence-angle-dependent transmission and reflection are shown in the plots of FIGS. 8A and 8B, respectively. In some examples, the incidence-angle-dependent transmission of the light-escape surface 40 is characterized by a half-transmission angle $\Theta_{TH}$ that is less than about 60. degrees, less than about 45. degrees, less than about 30. degrees, less than about 15. degrees, or even smaller.

FIGS. 6C and 6D are plots corresponding to the behavior of light when incident upon some examples of a nano- or micro-structured angular filter 50 (e.g., arranged as a partial photonic bandgap structure). In FIG. 6D, W represents the optical angular frequency and K represents the in-plane wavevector. The light line 161 is determined based on the configuration of the angular filter 50 and represents the boundary between light that can pass through the angular filter 50 and light that cannot. Further, limiting light below a given angular frequency W allows the emitter array 200 to produce a desired radiation emission distribution pattern 72 as in FIG. 6A or 10B (relative to distribution 71 of FIGS. 6A and 10A in the absence of the angular filter 50). As shown in FIG. 6C, the transmission light incident upon the angular filter 50 near unity below $\Theta TH$ and drops to zero after $\Theta_{TH}$ as a result of reaching the corresponding angular cutoff $K_{TH}$ shown in FIG. 6D. Accordingly, light emitted at $K > K_{TH}$ can pass through the angular filter 50.

Some examples of the nano-antennae 52 of the angular filter 50 can include one or more antenna materials (e.g., silicon or $TiO_2$), and can be shaped (e.g., cylindrical), sized relative to the nominal output vacuum wavelength $\lambda_0$ (e.g., 56 nm radius and 150 nm height for silicon with $\lambda_0=450$ nm; 56 nm radius and 250 nm height for $TiO_2$ with $\lambda_0=450$ nm), arranged along the light-escape surface 40 (e.g., a hexagonal grid), and spaced relative to the nominal output vacuum wavelength $\lambda_0$, (e.g., 200 nm grid spacing for $\lambda_0=450$ nm) so as to reradiate, upon irradiation by device output light, at least a portion of the device output light so as to result collectively in a desired or specified incidence-angle-dependent transmission. Other sizes, materials, antenna shapes (e.g., cylindrical, frusto-conical, horizontal dimers, vertical dimers, coaxial dimers, and so forth; as in, e.g., FIGS. 11A-11D), sizes, spacing, and arrangements (e.g., rectangular grid, hexagonal grid, other grids, or an irregular, aperiodic, or random arrangement) can be employed.

In some examples nano-antennae structures 52 can be arranged in either hexagonal or rectangular lattice. The lattice period can be sub-wavelength or larger than the nominal wavelength $\lambda_0$. The nano-antennae can be chosen to satisfy the first Kerker conditions so that the magnetic and electric dipole radiation cancel in the backward direction yielding a large forward scatter (also referred to as Huygens' meta-atoms). In examples including nano-cylinder vertical dimers and nano-cylinder horizontal dimers, interfering modes within the meta-atom or nano-antenna are believed to enable control of the scattered modes through manipulation of structural parameters.

Typically, calculation or computer simulation is required to achieve at least a preliminary design for a nano-antennae array; in some instances, a final design can be achieved by iterative experimental optimization of the various parameters by fabricating and characterizing test arrays. Note that an array that is not necessarily fully optimized can nevertheless provide incidence-angle-dependent transmission adequate to provide an acceptably narrowed emission angular distribution 72; such partly optimized arrays fall within the scope of the present disclosure or appended claims. Examples of suitable nano-antennae arrays can be found in, e.g., (i) U.S. Pat. Pub. No. 2020/0200955 entitled "High brightness directional direct emitter with photonic filter of angular momentum" published Jun. 25, 2020 in the names of Antonio Lopez-Julia and Venkata Ananth Tamma (now U.S. Pat. No. 11,041,983), (ii) U.S. Pat. Pub. No. 20210285625 entitled "Light-emitting device assembly with light redirection or incidence-angle-dependent transmission through an escape surface" published Sep. 16, 2021 in the names of Antonio Lopez-Julia and Venkata Ananth Tamma, (iii) Li et al, "All-Dielectric Antenna Wavelength Router with Bidirectional Scattering of Visible Light," *Nano Letters*, 16 4396 (2016), and (iv) (i) Shibanuma et al, "Experimental Demonstration of Tunable Directional Scattering of Visible Light from All-Dielectric Asymmetric Dimers," *ACS Photonics*, 4 489 (2017), each of which is incorporated by reference as if fully set forth herein.

In some examples, in addition to the incidence-angle-dependent transmission, the angular filter 50 can be further arranged to result in transmissive redirection of output light to propagate at an angle less than its incident or refracted angle (e.g., as in FIGS. 9A and 9B). In FIG. 9A, the angular filter 50 is formed on the emitter array 200 (directly on the semiconductor LED 102 or on the phosphor 106, if present). The transmitted light propagates in the fill medium 98 at an angle smaller than the refracted angle $\Theta_R$. In FIG. 9B, the angular filter 50 is formed on the substrate 50. The transmitted light propagates in the fill medium 98 at an angle smaller than the incident angle $\Theta_{IN}$ (assuming the fill medium 98 and the surrounding medium 99 have the same refractive index). In some examples different corresponding sets of elements 52 can be employed to provide incidence-angle-dependent transmission and transmissive redirection of the angular filter 50. In other examples a single set of element 52 provide both incidence-angle-dependent transmission and transmissive redirection of the angular filter 50.

In some examples, the angular filter 50 can include a partial photonic bandgap structure arranged with one or more materials, morphology, and spacing relative the nominal output vacuum wavelength $\lambda_0$, so as to redirect, upon irradiation by device output light, at least a portion of the device output light so as to result in a desired or specified incidence-angle-dependent transmission or transmissive redirection. In some examples the angular filter 50 can include a photonic crystal arranged with one or more materials, crystal morphology, and crystal-lattice spacing relative the nominal output vacuum wavelength $\lambda_0$, so as to redirect, upon irradiation by device output light, at least a portion of the device output light so as to result in a desired or specified incidence-angle-dependent transmission or transmissive redirection. In some examples the angular filter 50 can include an array of meta-atoms or meta-molecules that can include one or more meta-materials, and can be shaped, sized relative to the nominal output vacuum wavelength $\lambda_0$, arranged along angular filter 50, and spaced relative to the nominal output vacuum wavelength $\lambda_0$, so as to reradiate, upon irradiation by device output light, at least a portion of the device output light so as to result collectively in a desired or specified incidence-angle-dependent transmission or transmissive redirection. In any of those examples, calculation or simulation followed by iterative experimental optimization (or at least partial optimization) can be employed, in a manner similar to that described above.

In some examples the angular filter 50 can include a multi-layer dielectric thin film that incorporate two or more materials characterized by corresponding refractive indices and having layer thicknesses, relative the nominal output vacuum wavelength $\lambda_0$, so as exhibit a desired or specified incidence-angle-dependent transmission. For example, transmission spectra of conventional thin-film short pass (SP) or bandpass (BP) optical filters are known to shift to shorter wavelengths as the angle of incidence increases; non-transmitted light undergoes specular reflection. A suitable SP or BP filter can be designed to transmit device output light at normal incidence and within a specified angular range about normal incidence, but to reflect device output light outside the specified angular range for which the wavelength-dependent transmission spectrum of the filter has blue-shifted sufficiently. The SP or BP filter typically transitions between transmissive and reflective behaviors over some small angular range; the steepness of that transition depends on the specific filter design, and in some examples can be tailored to some extent to provide desired incidence-angle-dependent transmission. Other suitable arrangements based on multi-layer dielectric thin films can be employed. In some of those examples, the multi-layer thin film can be arranged so as to form an optical resonator among layers of the multi-layer dielectric thin film. Tuning a resonance wavelength of such a resonator, relative the nominal output vacuum wavelength $\lambda_0$, can be employed to at least partly determine the incidence-angle-dependent transmission of the multi-layer thin film.

The optical collector 60 (if present) can be arranged in any suitable way and can include any one or more suitable materials. The optical collector 30 can be realized as a concavity formed in a solid member (as shown in the drawings), or can be realized as a thin, concave shell. The inner surface of the optical collector 60 can redirect within the optical collector light that is incident on the inner surface within the optical collector cavity 65. The inner surface 31 of the optical collector 30 can include any one or more suitable material. In some examples the inner surface of the collector cavity 65 includes a specular reflector or a diffuse scatterer, such as a metal surface, a metallic coating, or a dielectric coating (e.g., a multi-layer dielectric thin film). In some examples the collector cavity inner surface can exhibit reflectivity or scattering efficiency greater than about 90.%, greater than about 95.%, greater than about 97.%, greater than about 98.%, or greater than about 99.%. In some examples the inner surface of the collector cavity 65 can include one or more of (i) an array of nano-antennae, (ii) a partial photonic bandgap structure, (iii) a photonic crystal, or (iv) an array of meta-atoms or meta-molecules. Such structures are described above, although such structures designed for use on the collector cavity inner surface and the structured lens 40 or angular filter 50 would typically differ from one another given their differing performance requirements. Any suitable open-ended shape can be employed for the collector cavity 65. Typically, a shape is employed that tapers from the open end toward the emitter array 200. In some examples, at least a portion of the inner surface 31 of the optical collector 30 can be shaped as (i) a frustum of a circular or elliptical cone, (ii) a frustum of a pyramid (of any suitable or desirable number of sides), or (iii) a portion of a sphere, spheroid, ellipsoid, paraboloid, hyperboloid, or ovoid.

In the example of FIG. 2, some output light reaches the inner surface of the collector cavity 65 and is reflected or scattered. Some of that light eventually exits through the substrate 45, and typically would blur or otherwise degrade the image of the emitter array formed by the structured lens 40. If has been observed that with up to 15% of overall output being such redirected light, degradation of the projected image remains acceptably low. The angular filter 50 ensures that at least some of such redirected light, and in some instance most of such redirected light, propagates toward the desired illuminated area, due to the reduced or eliminated transmission by the angular filter 50 at large angles-of-incidence.

Figure 14B:
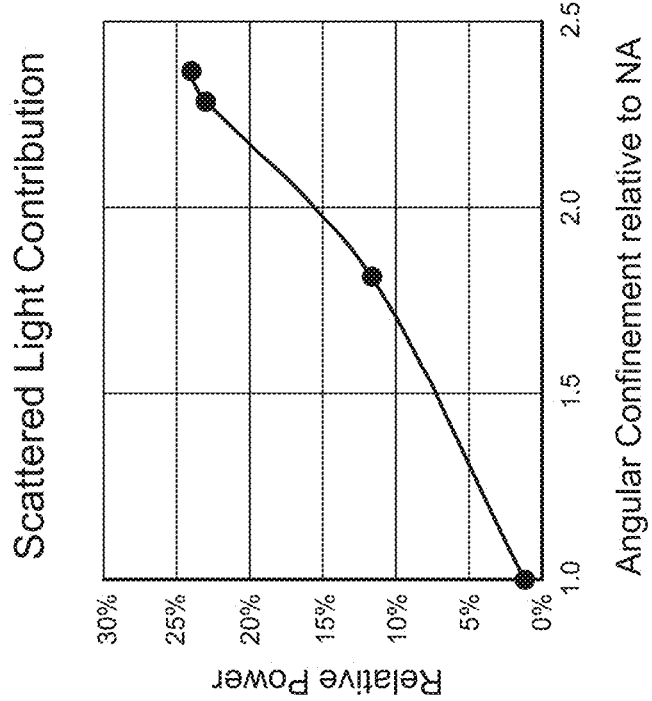
FIG. 14B is a plot, for the example of FIG. 3, of simulated relative contribution to output optical power of light scattered or reflected within the collector cavity as a function of array output NA relative to lens NA.
Figure 14A:
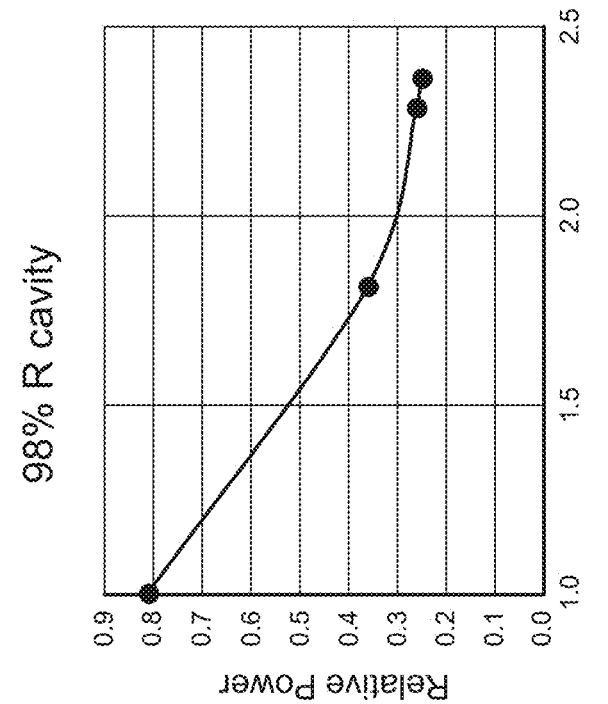
FIG. 14A is a plot, for the example of FIG. 3, of simulated relative optical power collected by the structured lens as a function of array output NA relative to lens NA for a collector cavity having R=98%.

In the example of FIG. 3, the relative amount of light redirected within the collector cavity 65 can be reduced. With the angular filter 50 positioned on the output surface of the emitter array, most of the output light can be directed to pass through the structured lens 40 for projection onto the illuminated area. The plots of FIGS. 14A and 14B illustrate the behavior of the assembly 10 as a function of the angular confinement of the output light leaving the emitter array 200 relative to the NA of the lens 40. FIG. 14A shows increasing overall efficiency as the angular confinement of the array output decreases toward the NA of the lens 40. FIG. 14B shows a decreasing contribution to the overall output of light redirected by the collector cavity 65 as the angular confinement of the array output decreases toward the NA of the lens 40.

In some examples the effective focal length of the structured lens 40 can be less than about 2.0 mm, less than about 1.5 mm, less than about 1.0 mm, or even smaller. In some examples the structure lens 40 can be characterized by a numerical aperture NA greater than about 0.5, greater than about 0.7, greater than about 1.0, or even larger. In some examples the transverse extent of the structured lens 40 can be greater than about 1.5 times, 2.0 times, or 3.0 times, or 5.0 times transverse extent of the emitter array 200.

In various examples, the nominal output vacuum wavelength $\lambda_0$, can be larger than about 0.20 μm, larger than about 0.4 μm, or larger than about 0.8 μm; in various examples, the nominal output vacuum wavelength $\lambda_0$ can be smaller than about 10. μm, smaller than about 2.5 μm, or smaller than about 1.0 μm. The light-emitting device 20 can be of any suitable type or arrangement, including those described above. In many examples an extended, incoherent light source can be employed. A common implementation includes an array of light-emitting diodes (LEDs) as the emitter array 200; examples of suitable LED materials can include one or more doped or undoped III-V, II-VI, or Group IV semiconductor materials or alloys or mixtures thereof. The emitter array can further include one or more wavelength-converting phosphors. For purposes of the present disclosure and appended claims, "at a nominal vacuum wavelength $\lambda_0$" means that the wavelength spectrum of the device output light includes a range of wavelengths that includes $\lambda_0$. In many examples the device output light is within about ±5 nm or about ±10 nm of $\lambda_0$; in other examples the spectral width of the device output light can be greater than that.

An inventive method for operating any of the light-emitting device assemblies 10 disclosed or claimed herein comprises: (A) selectively activating a first subset of light-emitting elements 100 of the emitter array 200 so that the activated elements 100 of the first subset emit output light from the emission surface of the emitter array 200 and so that the output light passes through the angular filter 50 and through the substrate 45; and (B) positioning the assembly 10 so that a first far-field illumination pattern, that corresponds to the first subset of light-emitting elements 100 and results from far-field imaging of the array 200 by the structured lens 40, illuminates a desired area or scene. The method can further include: (C) selectively activating a second subset of light-emitting elements 100 of the emitter array 200, different from the first subset, so that the activated elements 100 of the second subset emit output light from the emission surface of the emitter array 200 and so that the output light passes through the angular filter 50 and through the substrate 45; and (D) positioning the assembly 10 so that a second far-field illumination pattern, corresponding to the second subset of light-emitting elements and resulting from far-field imaging of the array 200 by the structured lens 40, illuminates a desired area or scene, the second far-field illumination pattern being different from the first far-field illumination pattern.

An inventive method for making any of the light-emitting device assemblies 10 disclosed or claimed herein comprises: (A) positioning and arranging the emitter array 200 and the substrate 45 so that output light emitted by the emitter array 200 is transmitted through the substrate 45; B) positioning the structured lens on or in the substrate; and (C) positioning the angular filter 50 on or in the substrate 45 or on the emission surface of the emitter array 200.

In addition to the preceding, the following examples fall within the scope of the present disclosure or appended claims:

Example 1. A light-emitting device assembly comprising: (a) an emitter array of multiple light-emitting elements, the emitter array being arranged so as to emit output light from an emission surface of the emitter array, the emitter array being structured and connected so as to enable selective activation of, and corresponding selective emission of output light from, individual elements of the emitter array or different subsets of elements of the emitter array; (c) a substantially transparent substrate positioned so that output light is transmitted through the substrate; (d) a structured lens positioned on or in the substrate in the path of the output light, the structured lens comprising micro- or nano-structured elements arranged so that the structured lens is characterized by an effective focal length that is less than an effective distance between the structured lens and the emission surface of the emitter array; and (e) an angular filter positioned in the path of the output light, on or in the substrate or on the emission surface of the emitter array, the angular filter being arranged so as to exhibit incidence-angle-dependent optical transmission of the output light that decreases with increasing angle of incidence or that has a cutoff angle of incidence above which optical transmission is substantially prevented.

Example 2. The assembly of Example 1 wherein the array and the structured lens are arranged so that far-field imaging of the emitter array by the structured lens results in a corresponding far-field illumination pattern, and so that selective activation of different subsets of elements of the array results in different corresponding far-field illumination patterns.

Example 3. The assembly of any one of Examples 1 or 2 wherein the structured lens is positioned on or near a surface of the substrate.

Example 4. The assembly of any one of Examples 1 through 3 wherein the structured lens is positioned on or near a surface of the substrate facing the emitter array and the angular filter is positioned on or near a surface of the substrate opposite the structured lens.

Example 5. The assembly of any one of Examples 1 through 3 wherein the angular filter is positioned on or near a surface of the substrate facing the emitter array and the structured lens is positioned on or near a surface of the substrate opposite the angular filter.

Example 6. The assembly of any one of Examples 1 through 3 wherein the angular filter is positioned on the emission surface of the emitter array.

Example 7. The assembly of any one of Examples 1 through 6 wherein the micro- or nano-structured elements of the structured lens include a multitude of suitably sized and shaped projections, holes, depressions, inclusions, or structures formed on or in the substrate, the micro- or nano-structured elements being arranged so as to collectively impart on the output light a transverse-position-dependent phase delay that results in the effective focal length of the structured lens.

Example 8. The assembly of any one of Examples 1 through 7 wherein the micro- or nano-structured elements of the structured lens include an array of nano-antennae, a partial photonic bandgap structure, a photonic crystal, or an array of meta-atoms or meta-molecules, the micro- or nano-structured elements being arranged so as to collectively impart on the output light a transverse-position-dependent phase delay that results in the effective focal length of the structured lens.

Example 9. The assembly of Example 8 wherein the micro- or nano-structured elements of the structured lens include an array of single nano-antennae, or double nano-antennae (i.e., dimers), that include one or more antenna materials, are shaped, sized, and spaced relative to a nominal output vacuum wavelength $\lambda_0$, and are arranged along the substrate surface, so as to reradiate, upon irradiation by the output light, at least a portion of the output light so as to result collectively in the effective focal length of the structured lens.

Example 10. The assembly of any one of Examples 8 or 9 wherein the micro- or nano-structured elements of the structured lens include a partial photonic bandgap structure arranged with one or more materials, morphology, and spacing relative to a nominal output vacuum wavelength $\lambda_0$, so as to redirect, upon irradiation by the output light, at least a portion of the output light so as to result in the effective focal length of the structured lens.

Example 11. The assembly of any one of Examples 8 through 10 wherein the micro- or nano-structured elements of the structured lens include a photonic crystal arranged with one or more materials, crystal morphology, and crystal-lattice spacing relative to a nominal output vacuum wavelength $\lambda_0$, so as to redirect, upon irradiation by output light, at least a portion of the output light so as to result in the effective focal length of the structured lens.

Example 12. The assembly of any one of Examples 8 through 11 wherein the micro- or nano-structured elements of the structured lens include an array of meta-atoms or meta-molecules that include one or more meta-materials, are shaped, sized, and spaced relative to a nominal output vacuum wavelength $\lambda_0$, and are arranged along the substrate, so as to reradiate, upon irradiation by the output light, at least a portion of the output light so as to result collectively in the effective focal length of the structured lens.

Example 13. The assembly of any one of Examples 1 through 12 wherein the angular filter is arranged so as to result in transmissive redirection of output light to propagate at an angle less than a corresponding incident angle or refracted angle.

Example 14. The assembly of any one of Examples 1 through 13 wherein the angular filter includes an array of nano-antennae, a partial photonic bandgap structure, a photonic crystal, an array of meta-atoms or meta-molecules, or a multi-layer dielectric thin film.

Example 15. The assembly of Example 14 wherein the angular filter includes an array of single nano-antennae, or double nano-antennae (i.e., dimers), that include one or more antenna materials, are shaped, sized and spaced relative to a nominal output vacuum wavelength $\lambda_0$, and arranged along the angular filter, so as to reradiate, upon irradiation by the output light, at least a portion of the output light so as to result collectively in the incidence-angle-dependent optical transmission or the transmissive redirection.

Example 16. The assembly of any one of Examples 14 or 15 wherein the angular filter includes a partial photonic bandgap structure arranged with one or more materials, morphology, and spacing relative to a nominal output vacuum wavelength $\lambda_0$, so as to redirect, upon irradiation by the output light, at least a portion of the output light so as to result in the incidence-angle-dependent optical transmission or the transmissive redirection.

Example 17. The assembly of any one of Examples 14 through 16 wherein the angular filter includes a photonic crystal arranged with one or more materials, crystal morphology, and crystal-lattice spacing relative to a nominal output vacuum wavelength $\lambda_0$, so as to redirect, upon irradiation by device output light, at least a portion of the device output light so as to result in the incidence-angle-dependent optical transmission or the transmissive redirection.

Example 18. The assembly of any one of Examples 14 through 17 wherein the angular filter includes an array of meta-atoms or meta-molecules that include one or more meta-materials, are shaped, sized and spaced relative to a nominal output vacuum wavelength $\lambda_0$, and arranged along the angular filter, so as to reradiate, upon irradiation by the output light, at least a portion of the output light so as to result collectively in the incidence-angle-dependent optical transmission or the transmissive redirection.

Example 19. The assembly of any one of Examples 14 through 18 wherein the angular filter includes a multi-layer dielectric thin film that includes two or more materials characterized by corresponding refractive indices and having layer thicknesses, relative a nominal output vacuum wavelength $\lambda_0$, so as to redirect, upon irradiation by the output light, at least a portion of the output light so as to result in the incidence-angle-dependent optical transmission.

Example 20. The assembly of Example 19 further comprising an optical resonator formed among layers of the multi-layer dielectric thin film, wherein the optical resonator is characterized by a resonance wavelength, relative the nominal output vacuum wavelength $\lambda_0$, that at least partly results in the incidence-angle-dependent optical transmission.

Example 21. The apparatus of any one of Examples 1 through 20 wherein the nominal output vacuum wavelength $\lambda_O$ is larger than about 0.20 μm, larger than about 0.4 μm, larger than about 0.8 μm, smaller than about 10. μm, smaller than about 2.5 μm, or smaller than about 1.0 μm.

Example 22. The assembly of any one of Examples 1 through 21 wherein the incidence-angle-dependent transmission of the angular filter is characterized by a half-transmission angle $\Theta_{TH}$ that is less than about 60. degrees, less than about 45. degrees, less than about 30. degrees, less than about 15. degrees, or even smaller.

Example 23. The assembly of any one of Examples 1 through 22 wherein the incidence-angle-dependent transmission of the angular filter is characterized by a cutoff angle $\Theta_C$ that is less than about 60. degrees, less than about 45. degrees, less than about 30. degrees, less than about 15. degrees, or even smaller.

Example 24. The assembly of any one of Examples 1 through 23 wherein the effective focal length of the structured lens is less than about 2.0 mm, less than about 1.5 mm, or less than about 1.0 mm.

Example 25. The assembly of any one of Examples 1 through 24 wherein the structured lens is characterized by a numerical aperture NA greater than about 0.5, greater than about 0.7, or greater than about 1.0.

Example 26. The assembly of any one of Examples 1 through 25 wherein transverse extent of the structured lens is greater than about 1.5 times, 2.0 times, or 3.0 times, or 5.0 times transverse extent of the array of light-emitting elements.

Example 27. The assembly of any one of Examples 1 through 26 further comprising a concave optical collector having a collector cavity with an open output end, the substantially transparent substrate being positioned across the open end of the collector cavity so that the output light is transmitted through the substrate.

Example 28. The assembly of Examples 27 wherein the collector cavity includes an optically reflective or diffusely scattering inner surface.

Example 29. The assembly of Example 28 wherein the inner surface exhibits reflectivity or scattering efficiency greater than about 90.%, greater than about 95.%, greater than about 97.%, greater than about 98.%, or greater than about 99.%.

Example 30. The assembly of any one of Examples 27 through 29 wherein at least a portion of the inner surface of the collector cavity is shaped as (i) a frustum of a circular or elliptical cone, (ii) a frustum of a pyramid, or (iii) a portion of a sphere, spheroid, ellipsoid, paraboloid, hyperboloid, or ovoid.

Example 31. The assembly of any one of Examples 1 through 30 wherein a volume between the emissions surface of the emitter array and the substrate is filled with ambient air or inert gas, or is evacuated.

Example 32. The assembly of any one of Examples 1 through 30 wherein a volume between the emissions surface of the emitter array and the substrate collector cavity is filled with a substantially transparent liquid or solid fill medium.

Example 33. The assembly of Example 32 wherein the fill medium includes one or more materials among: doped or undoped silicone, or one or more doped or undoped polymers.

Example 34. The assembly of any one of Examples 1 through 33 wherein a volume between the emission surface of the emitter array and the substrate is at least partly filled with a medium that is the same as an ambient medium.

Example 35. The assembly of any one of Examples 1 through 34 wherein the array of light-emitting elements is an array of semiconductor light-emitting diodes.

Example 36. The assembly of Example 35 wherein the semiconductor light-emitting diodes include one or more doped or undoped II-VI, or Group IV semiconductor materials or alloys or mixtures thereof.

Example 37. The assembly of any one of Examples 35 or 36 wherein one or more or all of the semiconductor light-emitting diodes include one or more corresponding wavelength-converting structures.

Example 38. The assembly of any one of Examples 1 through 37, each light-emitting element of the array being operable independently of all other light-emitting elements of the array.

Example 39. The assembly of any one of Examples 1 through 38 wherein the array of light-emitting elements is a 3×3 array, a 5×5 array, a 7×7 array, or a 10×10 array.

Example 40. The assembly of any one of Examples 1 through 38 wherein the array of light-emitting elements includes at least $10^2$, $10^3$, $10^4$, $10^5$, or $10^6$ light-emitting elements.

Example 41. The assembly of any one of Examples 1 through 40, spacing of the light-emitting elements of the array being less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm.

Example 42. The assembly of any one of Examples 1 through 41, the pixel elements exhibiting a contrast ratio for light emitted from adjacent light-emitting elements that is greater than 5:1, greater than 10:1, greater than 20:1, greater than 50:1, greater than 100:1, or greater than 300:1.

Example 43. The assembly of any one of Examples 1 through 42 wherein the substrate includes one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 44. The apparatus of any one of Examples 1 through 43, the micro- or nano-structured elements of the structured lens including one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 45. The apparatus of any one of Examples 1 through 44, the angular filter including one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 46. A method for operating the light-emitting device assembly of any one of Examples 1 through 45, the method comprising: (A) selectively activating a first subset of light-emitting elements of the emitter array so that the activated elements of the first subset emit output light from the emission surface of the emitter array so that the output light passes through the angular filter and through the substrate; and (B) positioning the assembly so that a first far-field illumination pattern, that corresponds to the first subset of light-emitting elements and results from far-field imaging of the array by the structured lens, illuminates a desired area or scene.

Example 47. The method of Example 46 further comprising: (C) selectively activating a second subset of light-emitting elements of the emitter array, different from the first subset, so that the activated elements of the second subset emit output light from the emission surface of the emitter array so that the output light passes through the angular filter and through the substrate; and (D) positioning the assembly 10 so that a second far-field illumination pattern, corresponding to the second subset of light-emitting elements and resulting from far-field imaging of the array 200 by the structured lens 40, illuminates a desired area or scene, the second far-field illumination pattern being different from the first far-field illumination pattern.

Example 48. A method for making the light-emitting device assembly of any one of Examples 1 through 45, the method comprising: (A) arranging the emitter array and the substrate with the substrate in the path of the output light; (B) positioning the structured lens on or in the substrate; and (C) positioning the angular filter on or in the substrate or on the emission surface of the emitter array.

It is intended that equivalents of the disclosed example apparatus and methods shall fall within the scope of the present disclosure or appended claims. It is intended that the disclosed example apparatus and methods, and equivalents thereof, may be modified while remaining within the scope of the present disclosure or appended claims.

In the foregoing Detailed Description, various features may be grouped together in several examples for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed example. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" would be interpreted as (i) one or more dogs and one or more cats without any mice, (ii) one or more dogs and one or more mice without any cats, (iii) one or more cats and one or more mice without any dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, unless explicitly stated otherwise, the words "comprising," "including," "having," and variants thereof, wherever they appear, shall be construed as open ended terminology, with the same meaning as if a phrase such as "at least" were appended after each instance thereof.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device assembly comprising:
   an emitter array of multiple light-emitting elements arranged so as to emit output light from an emission surface of the emitter array, the emitter array being structured and connected so as to enable selective activation of, and corresponding selective emission of output light from, individual elements of the emitter array or different subsets of elements of the emitter array;
   a substantially transparent substrate positioned so that the output light is transmitted through the substrate;
   a structured lens positioned on or in the substrate in the path of the output light, the structured lens comprising micro- or nano-structured elements arranged so that the structured lens is characterized by an effective focal length that is less than an effective distance between the structured lens and the emission surface of the emitter array; and
   an angular filter positioned on or in the substrate in the path of the output light, or on the emission surface of the emitter array, the angular filter being arranged so as to exhibit incidence-angle-dependent optical transmission of the output light that decreases with increasing angle of incidence or that has a cutoff angle of incidence above which optical transmission is substantially prevented.

2. The assembly of claim 1 wherein the array and the structured lens are arranged so that far-field imaging of the emitter array by the structured lens results in a corresponding far-field illumination pattern, and so that selective activation of different subsets of elements of the emitter array results in different corresponding far-field illumination patterns.

3. An optical apparatus incorporating the assembly of claim 2, the optical apparatus being arranged as an adaptive automotive headlight, an adaptive torch, or an adaptive camera flash.

4. The assembly of claim 1, the array of light-emitting elements comprising an array of semiconductor light-emitting diodes.

5. The assembly of claim 4, spacing of the light-emitting elements of the array being less than 0.10 mm.

6. The assembly of claim 5, the light-emitting elements of the array exhibiting a contrast ratio for output light emitted from adjacent light-emitting elements that is greater than 5:1.

7. The assembly of claim 4, one or more or all of the light-emitting diodes including one or more corresponding wavelength-converting elements.

8. The assembly of claim 1 wherein the angular filter is positioned on or near a surface of the substrate opposite the structured lens.

9. The assembly of claim 1 wherein the angular filter is positioned on the emission surface of the emitter array.

10. The assembly of claim 1 further comprising a concave optical collector having a collector cavity with an open output end, the substantially transparent substrate being positioned across the open end of the collector cavity so that the output light is transmitted through the substrate.

11. The assembly of claim 1 wherein the micro- or nano-structured elements of the structured lens include a multitude of suitably sized and shaped projections, holes, depressions, inclusions, or structures formed on or in the substrate, the micro- or nano-structured elements being arranged so as to collectively impart on the output light a transverse-position-dependent phase delay that results in the effective focal length of the structured lens.

12. The assembly of claim 11 wherein the micro- or nano-structured elements of the structured lens include an array of nano-antennae, a partial photonic bandgap structure, a photonic crystal, or an array of meta-atoms or meta-molecules, the micro- or nano-structured elements being arranged so as to collectively impart on the output light a transverse-position-dependent phase delay that results in the effective focal length of the structured lens.

13. The assembly of claim 1 wherein the angular filter includes an array of nano-antennae, a partial photonic bandgap structure, a photonic crystal, an array of meta-atoms or meta-molecules, or a multi-layer dielectric thin film.

14. The assembly of claim 13 wherein the angular filter is arranged so as to result in transmissive redirection of output light to propagate at an angle less than a corresponding incident angle or refracted angle.

15. The assembly of claim 1 wherein the effective focal length of the structured lens is less than about 2.0 mm.

16. The assembly of claim 1 wherein the structure lens is characterized by a numerical aperture NA greater than about 0.5.

17. The assembly of claim 1 wherein transverse extent of the structured lens is greater than about 1.5 times transverse extent of the array of light-emitting elements.

18. A method for operating a light-emitting device assembly, the method comprising:
   selectively activating a first subset of light-emitting elements of an emitter array arranged so that the activated elements of the first subset emit output light from an emission surface of the emitter array, the emitter array being positioned so that the output light passes through an angular filter arranged so as to exhibit incidence-angle-dependent optical transmission of the output light that decreases with increasing angle of incidence or that has a cutoff angle of incidence above which optical transmission is substantially prevented; and
   positioning the assembly so that a first far-field illumination pattern, corresponding to the first subset of light-emitting elements and resulting from far-field imaging of the array by a structured lens positioned on or in a substrate in the path of the of the output light, illuminates a desired area or scene, the structured lens comprising micro- or nano-structured elements arranged so that the structured lens is characterized by an effective focal length that is less than an effective distance between the structured lens and the emission surface of the emitter array.

19. The method of claim 18 further comprising:
selectively activating a second subset of light-emitting elements of the array, different from the first subset, so that the activated elements of the second subset emit output light from the emission surface of the emitter array so that the output light passes through the angular filter; and
positioning the assembly so that a second far-field illumination pattern, corresponding to the second subset of light-emitting elements and resulting from far-field imaging of the array by the structured lens, illuminates a desired area or scene, the second far-field illumination pattern being different from the first far-field illumination pattern.

20. A method for making a light-emitting device assembly, the method comprising:
positioning and arranging an emitter array and a substantially transparent substrate so that output light emitted from an emission surface of the emitter array is transmitted through the substrate, the emitter array having arranged thereon an array of multiple light-emitting elements and being structured and connected so as to enable selective activation of, and corresponding selective emission of output light from, individual elements of the emitter array or different subsets of elements of the array;
positioning on or in the substrate, in the path of the output light, a structured lens comprising micro- or nano-structured elements arranged so that the structured lens is characterized by an effective focal length that is less than an effective distance between the structured lens and the emission surface of the emitter array; and
positioning an angular filter on or in the substrate or on the emission surface of the emitter array, the angular filter being arranged so as to exhibit incidence-angle-dependent optical transmission of the output light that decreases with increasing angle of incidence or that has a cutoff angle of incidence above which optical transmission is substantially prevented.

\* \* \* \* \*